United States Patent

Obata et al.

[11] Patent Number: 6,025,857
[45] Date of Patent: Feb. 15, 2000

[54] PHOTOSENSITIVE MEMBER AND ELECTROSTATIC INFORMATION RECORDING METHOD

[75] Inventors: Hiroyuki Obata; Minoru Utsumi; Kohji Ichimura, all of Tokyo, Japan

[73] Assignee: Dai Nippon Printing Co., Ltd., Tokyo, Japan

[21] Appl. No.: 08/520,854

[22] Filed: Aug. 30, 1995

Related U.S. Application Data

[62] Division of application No. 08/407,253, Mar. 20, 1995, which is a continuation of application No. 08/040,280, Mar. 30, 1993, abandoned, which is a division of application No. 07/613,716, filed as application No. PCT/JP90/00340, Mar. 15, 1990, abandoned.

[30] Foreign Application Priority Data

| Mar. 17, 1989 | [JP] | Japan | 1-65464 |
| Mar. 17, 1989 | [JP] | Japan | 1-65470 |
| Mar. 18, 1989 | [JP] | Japan | 1-67244 |
| Mar. 18, 1989 | [JP] | Japan | 1-67246 |
| Mar. 18, 1989 | [JP] | Japan | 1-67247 |

[51] Int. Cl.⁷ ............. B41J 2/385; B41J 2/415; G03G 15/01; G01D 15/06
[52] U.S. Cl. .......... 347/120; 247/119; 247/130; 365/105; 365/109; 365/112; 365/115; 399/136
[58] Field of Search ............ 347/129, 130, 347/147, 119, 139; 365/105, 109, 115, 112; 399/136; 430/48, 54, 55

[56] References Cited

U.S. PATENT DOCUMENTS

| 3,864,720 | 2/1975 | Merrin . |
| 4,085,455 | 4/1978 | Okumura . |
| 4,207,100 | 6/1980 | Kadokura et al. . |
| 4,274,103 | 6/1981 | Yamamoto et al. . |
| 4,337,303 | 6/1982 | Sahyun et al. . |
| 4,410,614 | 10/1983 | Lelental et al. . |
| 4,613,557 | 9/1986 | Foley et al. .................. 430/59 |
| 4,904,557 | 2/1990 | Kubo . |
| 5,161,233 | 11/1992 | Matsuo et al. . |

FOREIGN PATENT DOCUMENTS

| 49-8232 | 1/1974 | Japan . |
| 49-52644 | 5/1974 | Japan . |
| 54-116930 | 9/1979 | Japan . |

OTHER PUBLICATIONS

R.M. Schaffert, "Electrophotography", 1965, *The Focal Press*, London, pp. 92–93.

*Primary Examiner*—Benjamin R. Fuller
*Assistant Examiner*—Raquel Yvette Gordon
*Attorney, Agent, or Firm*—Nikaido, Marmelstein, Murray & Oram LLP

[57] ABSTRACT

A photosensitive member which has an electrode provided on the front side and a photoconductive layer stacked on the electrode, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern. The layer arrangements of the photosensitive member and the photoconductive layer as well as the method of forming the photoconductive layer are improved so that electrostatic information can be recorded on the electrostatic information recording medium with high sensitivity and it is also possible to improve the contrast ratio of the information charge at the exposed region to that at the unexposed region.

4 Claims, 16 Drawing Sheets

FIG. 5
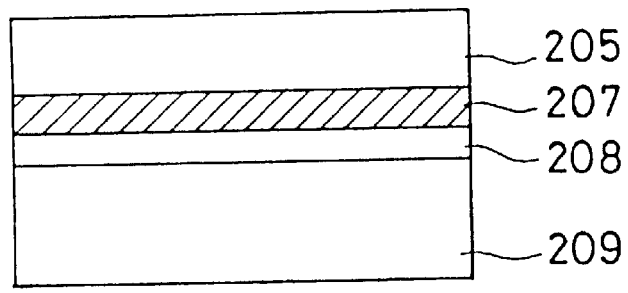
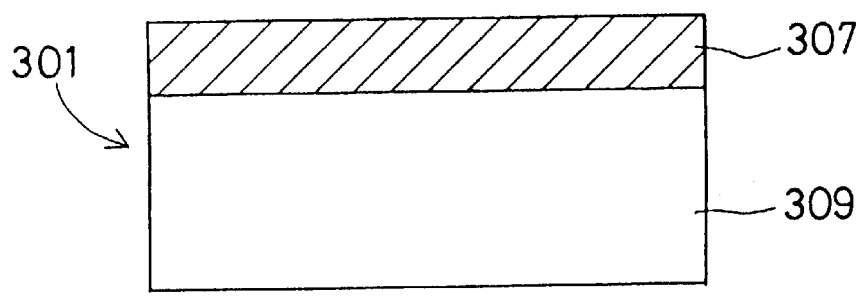
FIG. 6(a)
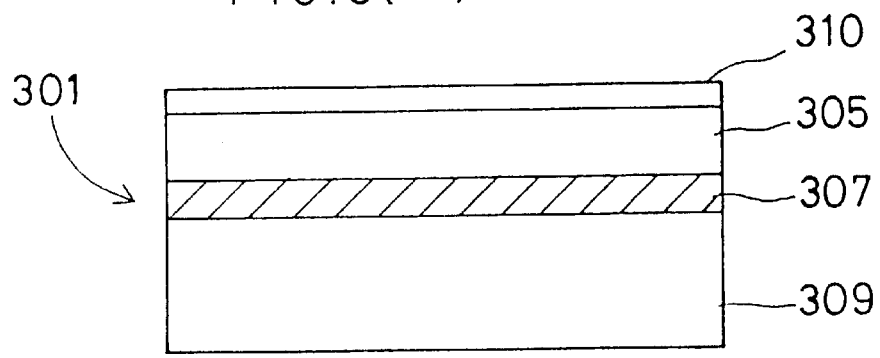
FIG. 6(b)

PHOTOSENSITIVE MEMBER AND ELECTROSTATIC INFORMATION RECORDING METHOD

This is a divisional, of application Ser. No. 08/407,253, filed Mar. 20, 1995, which in turn is a continuation of application Ser. No. 08/040,280, filed Mar. 30, 1993, now abandoned, which in turn is a divisional of application Ser. No. 07/613,716, filed Nov. 15, 1990, which in turn is a 371 of International Application PCT/JP90/00340, with an international filing date of Mar. 15, 1990, now abandoned.

TECHNICAL FIELD

The present invention relates to a photosensitive member which is used in an electrostatic information recording method wherein the photosensitive member is placed in opposing relation to an electrostatic information recording medium and exposure is carried out with a predetermined voltage being applied between the photosensitive member and the electrostatic information recording medium to form electrostatic charge information on the electrostatic information recording medium in accordance with the exposure energy, the member being highly sensitive and capable of improving the contrast ratio of the charge information in the exposed region to that in the unexposed region, and also relates to an electrostatic information recording method that uses this member.

BACKGROUND ART

Heretofore, silver halide photography has been known as a high-sensitive photographic technique. In this photographic method, the image is recorded on a film or the like through a wet developing process, and when the image is to be reproduced, a silver halide emulsion (silver halide photographic paper or the like) is employed, or the developed film is scanned optically to reproduce the image on a cathode ray tube (hereinafter referred to as "CRT").

There has also been an electrophotographic technique in which a photoconductive layer, which is formed on the electrode, is fully charged by corona charging in the dark and then exposed to large exposure energy to thereby change the exposed areas conductive, and the charge in the exposed areas is decreased, thereby an electrostatic latent image on the surface of the photoconductive layer is formed, and thereafter the toner development process in which an electrically charged toner which is opposite in polarity to (or the same as) the residual electrostatic charge is allowed to develop the latent image. This technique is, however, mainly used for xerographic purpose and cannot generally be used for photographic purpose because of low sensitivity. It is common practice to carry out the toner development immediately after the formation of an electrostatic latent image because the electrostatic charge is decreased in short time.

In TV recording technology, photographic recording is effected with an image pickup tube and image information that is obtained by utilization of semiphotoconductor is taken out in the form of an electric signal, which is then outputted to the CRT in this state, or subjected to video recording by use, for example, of magnetic recording to output the image on the CRT at any desired time.

Although the silver halide photography is superior as a means for storing object images, it needs a wet developing process to form a silver halide image and also requires a complicated optical, electrical or chemical processing for reproducing the image on a hard copy, a soft copy (CRT output), etc.

The electrophotographic technique enables the obtained electrostatic latent image to be made visible even more readiy and speedily than the silver halide photography but it permits the latent image to be stored only for an extremely short period and is inferior to the silver halide photography in terms of the dissociation of the developer, the picture quality and so forth.

The TV recording technology requires line sequential scanning to take out and record an electrical image signal that is obtained through an image pickup tube. The line sequential scanning is effected with an electron beam in an image pickup tube and with a magnetic head in video recording, but the resolution, which depends upon the number of scanning lines, is considerably inferior to planar analog recording such as silver halide photography.

Essentially the same is the case with a TV recording system that utilizes a solid-state imaging device (CCD, for example) in regard to the resolution.

These techniques involve the problems that high-quality and high-resolution image recording requires complicated processing, while simpler processing lacks storage function or involves basic degradation of picture quality.

If a photosensitive member that includes a photoconductive layer having an electrode provided on the front side and an electrostatic information recording medium that includes a charge retaining layer having an electrode provided on the rear side are disposed on an optical axis in opposing relation to each other and exposure is carried out with a voltage being applied between the two electrodes, an electrostatic latent image can be formed on the electrostatic information recording medium in accordance with an incident optical image. This method suffers, however, from the problems that the sensitivity is low, and since the electrostatic potential at the unexposed region is high, the contrast ratio of the exposed region to the unexposed region is low.

It is an object of the present invention to provide a photosensitive member which is highly sensitive and capable of applying information charge to an electrostatic information recording medium with an improved contrast ratio of the exposed region to the unexposed region.

DISCLOSURE OF INVENTION

The photosensitive member of the present invention includes eight forms.

In a first form of the present invention, there is provided a photosensitive member having an electrode provided on the front side and a photoconductive layer stacked on the electrode, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, wherein the photoconductive layer comprises at least one charge generation layer of amorphous silicon (a-Si) which is provided on the electrode and a charge transport layer that is stacked on the upper surface of the charge generation layer, the charge transport layer having a smaller dielectric constant than that of amorphous silicon.

When the photosensitive member is exposed, light carriers (e.g., holes) are generated in the photoconductive layer of the photosenstive member, and these light carriers are caused to move by an electric field that is produced between the two electrodes and reach the surface of the photoconductive layer, causing a discharging phenomenon in the air gap between the photosensitive member and the electrostatic information recording medium, or causing ionization of the air layer, thus enabling image information to be recorded on the electrostatic information recording medium in the form of electrostatic charge in accordance with the intensity of exposure. In the first photosensitive member, a-Si, which has superior charge generating performance, is used as a photoconductive layer, and a photosensitive material which has a relatively low dielectric constant is used as a charge transport layer, so that, when exposure is carried out with a voltage being applied between the photosensitive member and the electrostatic information recording medium, which are disposed face-to-face with each other, a higher voltage can be distributed to the photosensitive member by virtue of the charge transport layer having a relatively low dielectric constant, thereby enabling avoidance of application of a high voltage to the air gap. As a result, it is possible to reduce the electrostatic potential in the unexposed region on the electrostatic information recording medium and hence possible to obtain electrostatic information in the exposed region with a high contrast ratio with respect to the unexposed region.

In a second form of the present invention, there is provided a photosensitive member having an electrode provided on the front side and an insulating layer and a photoconductive layer, which are successively stacked on the electrode, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, wherein the photoconductive layer has a function of amplifying an electric charge that is generated in response to incident light.

In addition, there is an electrostatic information recording method that uses the above-described photosensitive member, in which the photosensitive member, which has an electrode provided on the front side and an insulating layer and a photoconductive layer, which are successively stacked on the electrode, and an electrostatic information recording medium that includes a charge retaining layer having an electrode provided on the rear side are disposed face-to-face with each other, either in or out of contact with each other, and exposure is carried out with a voltage being applied between the two electrodes to form an electrostatic charge pattern on the electrostatic information recording medium in accordance with an exposure light pattern, wherein the photoconductive layer has a function of amplifying electric charge that is generated in response to incident light, and a voltage which is high to such an extent that the photosensitive member will not be destroyed by electric discharge is applied between the two electrodes to accumulate an electrostatic charge pattern on the electrostatic information recording medium.

In the above-described photosensitive member and electrostatic information recording method, the photoconductive layer is formed such that it exhibits a photoelectric multiplication effect when pattern exposure is carried out by means of a voltage shutter with the photosensitive member and the electrostatic information recording medium being disposed face-to-face with each other. The photoelectric multiplication effect (avalanche effect) is a phenomenon that, when a photoconductive layer is irradiated with light, light carriers are generated, and if a high voltage is applied at that time, electrons or holes, which are light carriers, cause an electron avalanche phenomenon, so that a number of electrons or holes which is greater than that of carriers generated by light flows in the electric field direction.

In this photosensitive member, a photoconductive material that produces a photoelectric multiplication effect, for example, amorphous selenium (a-Si), is used, and a high voltage is applied to the photosensitive member, thereby enabling an electrostatic latent image to be formed on the electrostatic information recording medium at the exposed area in an amplified form. It is therefore possible to record amplified image information on the electrostatic information recording medium in accordance with the intensity of exposure even if the incident light is weak. It is also possible to obtain a photosensitive member that provides a high contrast ratio with respect to the unexposed region. The electrostatic latent image can be formed by planar analog recording or (0·1) signal recording with laser light or the like and can be held for a long period of time regardless of whether it is placed in a light place or dark place. In addition, it is possible to reproduce an image with a high resolution without the need for a complicated optical, electrical or chemical processing.

In a third form of the present invention, there is provided a photosensitive member having an electrode provided on the front side and a selenium layer stacked on the electrode, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, wherein the selenium layer is a black selenium layer that is obtained by evaporation with the temperature of the electrode layer being set in the range of from 80° C. to 120° C. at least at the beginning of the deposition process.

This photosensitive member is based on the finding that, if the selenium photoconductive layer is a black selenium layer that is obtained by evaporation with the temperature of the electrode layer being set in the range of from 80° C. to 120° C. at least at the beginning of the deposition process, it is possible to obtain a photosensitive member which has superior photosensitive characteristics in the long wavelength region. If this photosensitive member is used in an electrostatic information recording method, information charge can be effectively accumulated on the charge retaining layer even with exposure light in the long wavelength region, and it is also possible to realize an electrostatic information recording method of high sensitivity.

In a fourth form of the present invention, there is provided a photosensitive member including a photoconductive layer having an electrode provided on the front side, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, the photosensitive member being characterized by having a function of amplifying an electric charge that is injected from the electrode in accordance with the intensity of exposure.

In this photosensitive member, the photoconductive layer may be adapted to have an optical memory function or to have a function of amplifying electric charge that is injected from the electrode side by irradiation with light.

In the case where the photoconductive layer is arranged to have a memory function, if the voltage application state is continued after the exposure, light carriers are continuously generated by virtue of the memory function, and it is possible to accumulate electric charge on the electrostatic information recording medium with an amplifying function.

If the photoconductive layer is formed from a photoconductive layer having a function of amplifying electric charge that is injected from the electrode side by irradiation with light, for example, an n-i-p-i-n junction structure of amorphous silicon, it is possible to inject from the electrode an amount of charge which is greater than that of light carrier which is generated during the exposure and hence possible to produce a charge injection amplifying effect.

By arranging the photoconductive layer to have a charge injection amplifying function in this way, it is possible to form an image charge on the electrostatic information recording medium even with weak incident light and hence possible to record electrostatic information on the electrostatic information recording medium with high sensitivity. Accordingly, the charge is accumulated on the electrostatic information recording medium in the form of an amplified electrostatic latent image even with weak incident light and in accordance with the intensity of exposure. The electrostatic latent image can be formed by planar analog recording or (0·1) signal recording with laser light or the like and can be held for a long period of time regardless of whether it is placed in a light place or dark place. In addition, it is possible to reproduce an image with a high resolution without the need for a complicated optical, electrical or chemical processing.

In a fifth form of the present invention, there is provided a photosensitive member including a photoconductive layer that has an electrode provided on the front side, the photosensitive member being disposed face-to-face with an electrostatic information recording medium that includes a charge retaining layer having an electrode provided on the rear side, in contact with each other, to carry out exposure with a voltage being applied between the two electrodes, thereby forming an electrostatic charge pattern on the electrostatic information recording medium in accordance with an exposure light pattern, wherein a charge injection layer is provided on the surface of the photoconductive layer of the photosensitive member, the charge injection layer injecting into the photoconductive layer an electric charge which is opposite in polarity to the electrode of the photosensitive member.

In this photosensitive member, the photosensitive member and the electrostatic information recording medium are disposed face-to-face with each other with the electrodes of the photosensitive member and the electrostatic information recording medium being set positive and negative, respectively, for example, and pattern light is applied with a voltage being applied between the two electrodes. At this time, if a voltage which is sufficiently high to cause a discharge phenomenon between the electrostatic information recording medium and the photosensitive member, for example, 500 V to 3000 V, is applied, it is possible to inject into the photoconductive layer a number of electrons which is greater than that of light carriers (holes in this case) that are produced by the pattern exposure. As a result, holes, which are paired charges, are accumulated on the electrostatic information recording medium in excess of the number of light carriers.

If a charge injection layer having a function of injecting into the photoconductive layer an electric charge which is opposite in polarity to light carriers moving to the surface of the photosensitive member is provided on the surface of the photoconductive layer, as described above, it is possible to form image charge in the exposed region on the electrostatic information recording medium with an effective contrast ratio with respect to the unexposed region and hence possible to record electrostatic information on the electrostatic information recording medium with high sensitivity. Accordingly, the charge can be accumulated on the electrostatic information recording medium in the form of an amplified electrostatic latent image even with weak incident light and in accordance with the intensity of light. In addition, the electrostatic latent image has advantageous effects which are similar to those of the above-described fourth photosensitive member.

In a sixth form of the present invention, there is provided a photosensitive member having an electrode provided on the front side and a photoconductive layer stacked on the electrode, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, wherein the photoconductive layer comprises a layer that is formed by dispersing photoconductive fine particles into an insulative binder.

In this photosensitive member, the photoconductive layer comprises a layer that is formed by dispersing photoconductive fine particles into an insulative binder. If this photosensitive member is used for recording of information on the electrostatic information recording medium by carrying out exposure during the application of a voltage, the photoconductive fine particles, which are dispersed in an insulative binder, constitute a photoconductive insulating layer, although the photoconductive fine particles have electrical conductivity because of the crystalline structure.

Thus, the photosensitive member of the present invention can exhibit the advantages of crystalline photoconductive fine particles, such as those which are exemplarily mentioned below:

(1) If selenium fine particles, for example, crystalline selenium fine particles, are employed as crystalline photoconductive fine particles, it is possible to obtain a red light sensitivity (600 to 800 nm), which cannot be obtained with amorphous selenium.

(2) If fine particles are formed from a mixture or alloy of sensitizer components, for example, crystalline Se and Te, panchromatic characteristics can be readily obtained.

(3) A Se-Te layer is generally prepared by evaporation, for example, multiple evaporation, but it is difficult to obtain a desired composition ratio. In the present invention, however, sensitizer components, for example, tellurium and so forth, can be prepared in a predetermined composition before being used in the form of fine particles, and it is therefore possible to set a mixing ratio for sensitization appropriately and with ease.

(4) In addition, it is possible to make use of useful physical properties of crystalline selenium: For example, the mobility of light carriers is high in crystalline selenium, so that no field strength attenuation due to generation of space charge occurs.

Accordingly, it is possible to realize a photosensitive member which has light sensitivity over a wide wavelength range and a high migration velocity of light carriers. In addition, since it is possible to produce such a photosensitive member simply by coating, the production is easier than the formation of a photoconductive layer by evaporation or the like. The use of this photosensitive member for the electrostatic information recording method enables realization of a recording method of high sensitivity.

In a seventh form of the present invention, there is provided a photosensitive member having a barrier modulation layer that is formed on a substrate with a conductive layer interposed therebetween, the barrier modulation layer enabling the barrier size to vary with the intensity of exposure, the photosensitive member being disposed face-to-face with an electrostatic information recording medium having an insulating layer formed on a substrate with a conductive layer interposed therebetween, wherein electric charge is accumulated in the form of an image on the surface of the electrostatic information recording medium by carrying out information exposure with a voltage being applied between the respective conductive layers of the photosensitive member and the electrostatic information recording medium.

In addition, there is provided an electrostatic information recording method that uses the above-described photosensitive member, in which the photosensitive member, which has a photoconductive layer formed on a substrate with a conductive layer interposed therebetween and an electrostatic information recording medium that has an insulating layer formed on a substrate with a conductive layer interposed therebetween are disposed face-to-face with each other, and image exposure is carried out from the photosensitive member side with a voltage being applied between the respective conductive layers of the photosensitive member and the electrostatic information recording medium, thereby accumulating electric charge in the form of an image on the surface of the electrostatic information recording medium, wherein the improvement is characterized in that a barrier modulation layer which enables the barrier size to vary with the intensity of exposure is interposed between the conductive and photoconductive layers of the photosensitive member, and information exposure is carried out by superposing a wavelength in a wavelength range within which no absorption occurs in the barrier modulation layer.

There is also provided an electrostatic information recording method that uses the above-described photosensitive member, in which the photosensitive member, which has a photoconductive layer formed on a substrate with a conductive layer interposed therebetween and an electrostatic information recording medium that has an insulating layer on a substrate with a conductive layer interposed therebetween are disposed face-to-face with each other, and image exposure is carried out from the photosensitive member side with a voltage being applied between the respective conductive layers of the photosensitive member and the electrostatic information recording medium, thereby accumulating electric charge in the form of an image on the surface of the electrostatic information recording medium, wherein the improvement is characterized in that a barrier modulation layer which enables the barrier size to vary with the intensity of exposure is interposed between the conductive and photoconductive layers of the photosensitive member, and information exposure is carried out from the photosensitive member side and, at the same time, overall exposure is carried out from the electrostatic information recording medium side.

Thus, a barrier modulation layer which enables the barrier size to vary with the intensity of exposure is provided on the conductive layer of the photosensitive member to cut off a dark current by the barrier when the photosensitive member is in an unexposed state and to cancel the barrier by carriers which are generated when information exposure is carried out, thereby rapidly increasing the amount of current, and thus enabling electric charge to be accumulated on the electrostatic information recording medium with a high gain. Since the dark current can be cut off by the switching function of the barrier modulation layer and a large current density can be obtained by the amplifying function thereof, it becomes possible to form a bright image.

In an eighth form of the present invention, there is provided a photosensitive member including a photoconductive layer that has an electrode provided on the front side, the photosensitive member being disposed face-to-face with an electrostatic information recording medium that includes a charge retaining layer having an electrode provided on the rear side, either in or out of contact with each other, to carry out exposure with a voltage being applied between the two electrodes, thereby forming an electrostatic charge pattern on the electrostatic information recording medium in accordance with an exposure light pattern, wherein the photoconductive layer of the photosensitive member comprises a charge generation layer, a superlattice avalanche photodiode (APD) layer and a charge transport layer, which are successively stacked on the electrode.

In this photosensitive member, the photosensitive member comprises a charge generation layer, a super lattice avalanche photodiode layer and a charge transport layer, which are successively stacked, so that light carriers which are formed in the charge generation layer when exposure is carried out during the application of a voltage are amplified in the APD layer and transported by the charge transport layer to reach the surface that faces the electrostatic information recording medium, thus enabling an image charge to be formed on the electrostatic information recording medium. It is therefore possible to form an electric charge on the electrostatic information recording medium through amplification even when the incident light is weak, and it is possible to obtain electrostatic information on the electrostatic information recording medium with a high contrast ratio of the exposed region to the unexposed region.

BRIEF DESCRIPTION OF THE DRAWINGS

FIG. 5 is a sectional view of a second photosensitive member;

FIGS. 6a and 6b are a sectional view of a third photosensitive member;

FIGS. 11a and 10b show the energy level in a photoconductive layer of the fourth photosensitive member;

BEST MODE FOR CARRYING OUT THE INVENTION

The first photosensitive member will first be explained.

Figure 1:
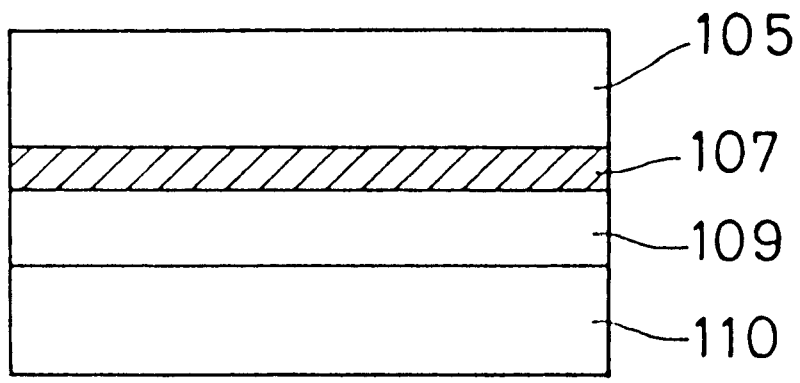
FIG. 1 is a sectional view of a first photosensitive member.

Referring to FIG. 1, which is a sectional view of the first photosensitive member, reference numeral 105 denotes a substrate, 107 an electrode layer, 109 an a-Si photoconductive layer, and 110 a charge transport layer.

The photosensitive member is formed by first stacking the a-Si photoconductive layer 109 on the electrode layer 107 by CVD (Chemical Vapor Deposition), sputtering or the like, which is stacked on the substrate 105, and then stacking thereon a photoconductive material to form the charge transport layer 110, the photoconductive material having charge transport properties and a lower dielectric constant than that of a-Si. If necessary, a charge injection preventing layer of $SiO_2$, SiN, SiC, $Al_2O_3$ or the like may be provided to a film thickness of about 100 to 3000 Å in between the electrode layer and the a-Si photoconductive layer (a-Si layer) to prevent or reduce the charge injection from the electrode into the a-Si layer. To attain the same object, a rectifying effect may also be utilized. When a rectifying effect is utilized, if charges that are undesirably injected from the electrode of the photosensitive member are positive, an N-type a-Si rectifying layer may be provided, whereas, if such charges are negative, a P-type a-Si rectifying layer may be provided. The film thickness of the rectifying layer need not be so strictly set as in the case of the film thickness of the charge injection preventing layer. The film thickness of the rectifying layer may be in the range of from about 0.1 μm to 5 μm. In addition, a layer that aids charge injection may be provided in between the a-Si layer 109 and the charge transport layer 110, if necessary.

The a-Si layer, which functions as a charge generation layer, may be deposited on a substrate electrode by introducing silane gas and hydrogen gas, together with impurities (described later), if necessary, under a low vacuum ($10^{-2}$ to 1 Torr), while heating the substrate by glow discharge, or may be formed on a heated substrate electrode by a thermochemical reaction, or may be formed by sputtering of a solid material in a hydrogen gas atmosphere. The a-Si layer may comprise either a single layer or a plurality of stacked layers.

If the polarity of the electrode is positive (+), it is preferable to form a P-type layer, that is, hole transport type layer, by doping the layer with B, Al, Ga, In, Tl, etc. If the polarity of the electrode is negative (−), it is preferable to form an N-type layer, that is, electron transport type layer, by doping the layer with phosphorous, silver, antimony, bismuth, etc. It should be noted that, in the case of an a-Si layer, it can be used in a non-doped state without the need to introduce a doping gas because a-Si is essentially superior in both electron and hole transport functions.

The charge transport layer, which transports light carriers that are generated in the charge generation layer, needs to be formed so as to transport either holes or electrons in accordance with the polarity of the electrode by use of a material which has a lower dielectric constant than that of the a-Si layer.

If the electrode is positive (+), it is preferable to use an amorphous selenium having excellent hole transport properties, or an organic photosensitive material, for example, a hydrazone, pyrazoline, PVK, carbazole, oxazole, triazole, aromatic amine, amine, triphenylmethane or polycyclic aromatic compound photosensitive material.

In the case of a-Se, it can be formed on the a-Si layer by evaporation, sputtering, etc. It is preferable to stack at least one layer of a-Se, amorphous selenium tellurium, amorphous arsenic selenium compound (a-$As_2Se_3$), amorphous arsenic selenium compound (a-$As_2Se_3$)+tellurium, etc., or a combination of various kinds of a-Se. In the case of an organic photosensitive material, it is preferable to dissolve it in a solvent and coat the resulting solution on the charge generation layer by spinner coating, for example.

If the electrode is negative (−), it is preferable to use zinc oxide or cadmium sulfide, which has excellent electron transport properties, or an organic charge transport material, for example, a charge transfer complex, i.e., polyvinylcarbazole (PVK)-2-4-7-trinitrofluorenone (TNF). The method of formation may be coating or CVD. In the case of coating, it is preferable to disperse zinc sulfide particles (particle diameter: 1 to 100 μm) into a binder, add a solvent thereto and coat the resulting solution on the a-Si layer, or mix together an organic metal, for example, diethylzinc, dimethylzinc, etc., and oxygen gas under a low vacuum ($10^{-2}$ to 1 Torr) and cause the mixture to take place a chemical reaction on the a-Si layer heated (150° C. to 400° C.) so that it is deposited in the form of a zinc oxide film.

When coating process is used, 0.1 to 10 parts of a binder, for example, a silicone resin, styrene-butadiene copolymer resin, epoxy resin, acrylic resin, saturated or unsaturated polyester resin, polycarbonate resin, polyvinyl acetal resin, phenolic resin, polymethyl methacrylate (PMMA) resin, melamine resin, polyimide resin, etc., is added to 1 part of charge transport material with a view to facilitating adhesion.

The film thicknesses of the a-Si layer and the charge transport layer are preferably from 0.1 to 10 μm and from 10 to 50 μm, respectively.

A discharge intensifying layer may be formed on the photoconductive layer that comprises the a-Si layer and the charge transport layer, which are formed in the way described above. Examples of usable discharge intensifying materials are BaO, CaO, SrO, MgO, $CeB_6$, CsSb, Sb-Rb-Cs, Ag-O-Cs, W-Th, TiC, TiO, $Y_2O_3$, $La_2O_3$, $Dy_2O_3$, $ThO_2$, etc.

The discharge intensifying layer may be formed by an ordinary thin film forming means, for example, evaporation, sputtering, plasma CVD, or a method wherein a discharge intensifying material that is dispersed into a binder is coated. The film thickness of the discharge intensifying layer is preferably from 50 Å to 5000 Å, particularly preferably from 100 Å to 1000 Å.

There are no specific restrictions on the thickness and material of the substrate, provided that it is sufficiently strong to support the photosensitive member. Examples of usable materials are a flexible plastic film, metal foil, paper or a rigid material such as glass, plastic sheet, metal sheet (capable of serving also as an electrode), etc. However, if the photosensitive member is employed in a system wherein light is applied from the photosensitive member side to record information, the substrate needs to be capable of transmitting the light, as a matter of course. For example, if the photosensitive member is employed in a camera wherein natural light is applied as incident light from the photosensitive member side, a transparent glass sheet or a plastic film or sheet, which has a thickness of about 1 mm.

The electrode is formed on the substrate except when the substrate comprises a metallic material. There is no restriction on the material of the electrode, provided that the resistivity of the material is not higher than $10^6$ ohm-cm. Examples of such material are an inorganic metallic conductive film, inorganic metallic oxide conductive film, etc. Such an electrode is formed on the substrate by evaporation, sputtering, CVD, coating, plating, dipping, electrolytic polymerization or the like. The film thickness of the electrode needs to be changed depending upon the electrical characteristics of the material thereof and the level of voltage applied to effect recording of information. If the electrode is made of aluminum, for example, the thickness is about from 100 to 3000 Å. If information light needs to be incident on the electrode in the same way as in the case of the substrate, the electrode is required to have the above-described optical characteristics. If the information light is visible light (400 to 700 nm), the photosensitive member electrode may be a transparent electrode, translucent electrode or transparent organic electrode. The transparent electrode may be formed by sputtering or evaporating ITO ($In_2O_3$—$SnO_2$), $SnO_2$ or the like or by coating a mixture of a fine powder of such a material and a binder in the form of ink. The translucent electrode may be produced by evaporating or sputtering Au, Al, Ag, Ni, Cr or the like. The transparent organic electrode may be formed by coating tetracyanoquinodimethane (TCNQ), polyacetylene or the like.

In the case where the information light is infrared light (700 nm or more) also, the above-mentioned electrode materials may be used. A colored visible light absorbing electrode may also be used for cutting off visible light, depending upon the situation.

In the case where the information light is ultraviolet light (400 nm or less) also, the above-mentioned electrode materials may be basically used. However, an electrode substrate material which absorbs ultraviolet light (e.g., an organic polymeric material, soda glass or the like) is not preferable. A material which transmits ultraviolet light, such as quartz glass, is preferable.

In addition, it is preferable to form an antireflection film on the surface of the photosensitive member on which information light is incident. The antireflection film can be formed by depositing at least one layer of an inorganic material, for example, magnesium fluoride, titanium oxide, etc., by evaporation or sputtering.

An electrostatic information recording method that uses the first photosensitive member will next be explained with reference to FIG. 2. In the figure, reference numeral 101 denotes a photosensitive member, 3 an electrostatic information recording medium, 11 a charge retaining layer, 13 an electrode, 15 a carrier, and 17 a power source.

The electrostatic information recording medium 3, on which is formed an electrostatic latent image by the photosensitive member of the present invention, is formed by stacking the charge retaining layer 11 on the electrode 13.

The charge retaining layer 11, which is made of a highly insulative polymeric material in order to suppress the movement of charges, is required to have insulating properties, i.e., $10^{14}$ ohm-cm or higher in terms of resistivity. A polymeric material for the charge retaining layer 11 needs to have a glass transition temperature which is higher than the temperature of an environment in which the photosensitive member is used.

Examples of resins which are usable as such a polymetic material are thermoplastic resins, thermosetting resins, energy radiation curing resins such as ultraviolet curing resins and electron radiation curing resins, and engineering plastics. Examples of usable thermoplastic resins are fluorocarbon resins, e.g., polytetrafluoroethylene, fluorinated ethylene propylene, tetrafluoroethylene-perfluoroalkyl vinyl ether copolymer, or dispersion type materials of these resins, or modified type (coating type) materials of these resins. It is also possible to use polyether ether ketone resin, polyparaxylyrene and so forth. A material selected from among those which are described above is coated or evaporated on the electrode of the electrostatic information recording medium, thereby forming the charge retaining layer 11.

FIG. 2 shows a mode in which exposure is effected from the side of the photosensitive member 101 of the present invention to form an electrostatic latent image on the electrostatic information recording medium 3.

The electrostatic information recording medium comprises a substrate 15 made of 1 mm thick glass, a 1000 Å thick Al electrode 13 formed on the substrate 15 by evaporation, and a 10 μm thick charge retaining layer 11 formed on the electrode 13.

Figure 2A:
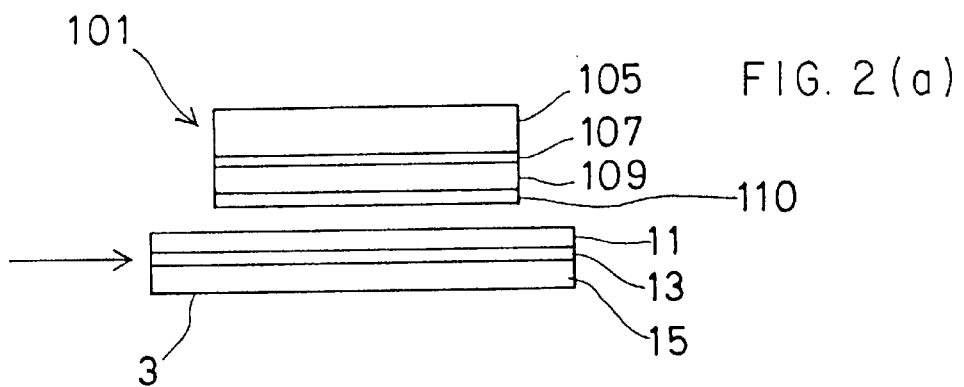
FIGS. 2a–2d show an electrostatic information recording method that uses a photosensitive member.
Figure 2B:
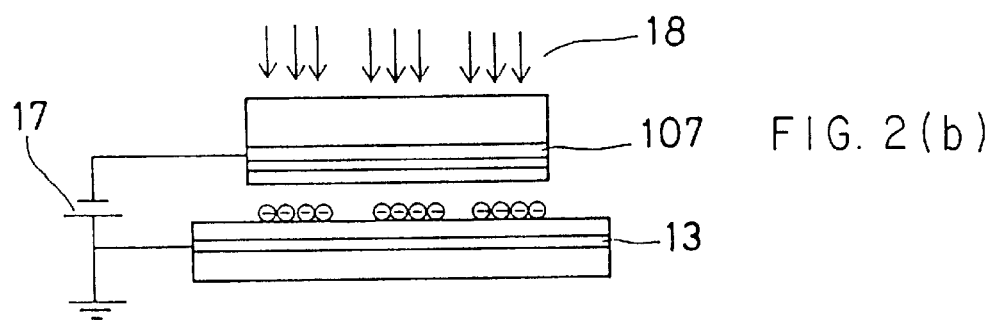

First, as shown in FIG. 2(a), the electrostatic information recording medium is set so as to face the photosensitive member across an air gap of about 10 μm, and a voltage is applied between the electrodes 107 and 13 from the power source 17, as shown in FIG. 2(b). No change occurs between the electrodes in a dark place since the photoconductive layer is a high resistant material. When light enters from the side of the photosensitive member, the portions of the photoconductive layer where the light is incident become conductive, and hence an electric discharge occurs between the photoconductive layer and the charge retaining layer 11, thus electric charge being accumulated on the charge retaining layer 11.

Figure 2C:
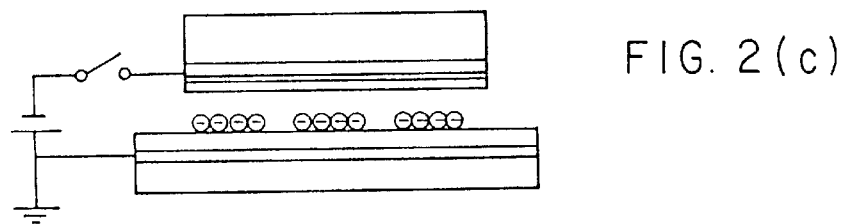
Figure 2D:
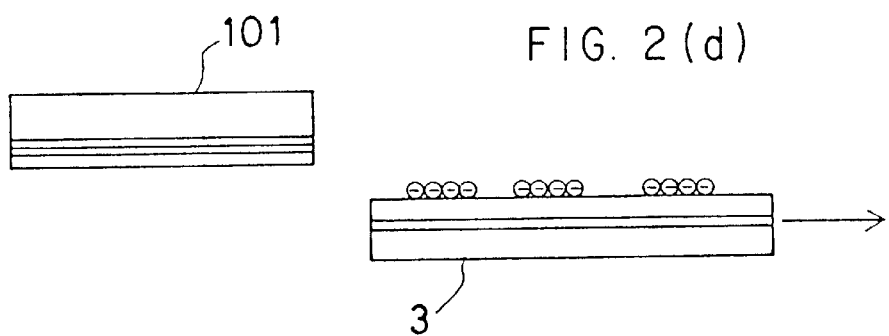

After the exposure, the voltage is cut off, as shown in FIG. 2(c), and then the electrostatic information recording medium 3 is taken out, as shown in FIG. 2(d), thus completing the formation of an electrostatic latent image.

In this way, information is stored in the form of information charge. It is preferable to stack an insulative protecting film on the charge retaining layer. By doing so, no electric discharge occurs, and the information charge is stored for a long period of time regardless of whether it is placed in a light place or dark place. It is considered that the information charge can be stored for a long period of time because the information charge may be stored simply on the surface and, microscopically, it may also enter the inside of the charge retaining layer near the surface thereof, resulting in electrons or holes being trapped in the structure of the substance that constitutes the layer.

As a method of inputting information, a method using a high-resolution electrostatic camera or a recording method using laser may be employed. The high-resolution electrostatic camera that is used in the present invention employs, in place of a photographic film used in an ordinary camera, a recording member which comprises a photosensitive member and an electrostatic information recording medium to store an electrostatic latent image on the charge retaining layer in the same way as in the above-described electrostatic information recording method. Either a mechanical or electric shutter can be used for this camera.

It is also possible to conduct color photography by using a color filter by which light information is separated into R, G and B light components and taken out in the form of parallel rays through prisms, and forming one frame from the charge retaining medium separated into R, G and B light components or from one set of R, G and B images arranged on one plane.

In the recording method by laser, argon laser (514 nm, 488 nm), helium-neon laser (633 nm) or semiconductor laser (780 nm, 810 nm, etc.) may be used as a light source. The photosensitive member and the electrostatic information recording medium are brought into close contact with each other at their surfaces or they are placed so as to face each other at a predetermined distance, and a voltage is applied thereto. In this case, it is preferable to set the photosensitive member electrode so as to have the same polarity as that of carriers in the photosensitive member. Under such conditions, laser exposure corresponding to a picture image signal, character signal, code signal or line drawing signal is performed by scanning. Analog recording such as that of a picture image is effected by modulating the intensity of laser light, whereas digital recording such as that of characters, code or line drawing is effected by on/off control of laser light. A picture image consisting of halftone dots is formed by on/off controlling laser light through a dot generator.

A method of reproducing the electrostatic information recorded on the electrostatic information recording medium will next be explained.

Figure 3:
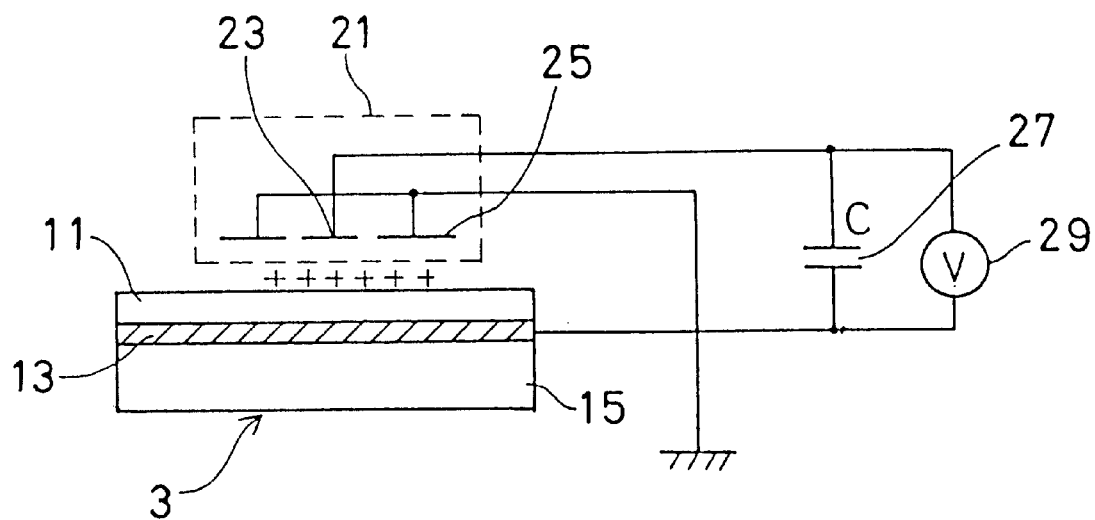
FIG. 3 shows a method of reading a potential of electrostatic information.

FIG. 3 shows an example of the method of reading the electric potential of the electrostatic information stored on the electrostatic information recording medium, in which the same reference numerals as those shown in FIG. 1 denote the same contents. In this figure, reference numeral 21 denotes an electric potential reading unit, 23 a detection electrode, 25 a guard electrode, 27 a capacitor, and 29 a voltmeter.

When the electric potential reading unit 21 is placed face-to-face with the charge accumulating surface of the electrostatic information recording medium 3, an electric field that is generated by the electric charge accumulated on the charge retaining layer 11 of the electrostatic information recording medium 3 acts on the detection electrode 23, and an electric charge equivalent to the charge on the electrostatic information recording medium is induced on the surface of the detection electrode. Since the capacitor 27 is charged with an electric charge equivalent to induced charge and the charge of the capacitor have a polarity opposite to that of the induced charge, a potential difference is produced between the electrodes of the capacitor. By reading this value with the voltmeter 29, the electric potential on the charge retaining medium can be obtained. By scanning the surface of the electrostatic information recording medium with the electric potential reading unit 21, an electrostatic latent image can be outputted in the form of an electric signal. It should be noted that, when the detection electrode 23 alone is used, the resolution may be reduced by the action of an electric field (electric lines of force) produced by the electric charge in a wider range than the region of the electrostatic information recording medium which faces the detection electrode. Therefore, a guard electrode 25 which is grounded may be disposed around the detection electrode. Thus, the electric lines of force are directed to extend perpendicular to the plane, so that the electric lines of force only in the region facing the detection electrode 23 act. This makes it possible to read the electric potential at a region which has approximately the same area as that of the detection electrode. Because the accuracy and resolution of the potential reading greatly depend upon the shape and size of the detection electrode and the guard electrode, together with the distance from the electrostatic information recording medium, it is essential to design on the basis of optimal conditions obtained in conformity with the required performance.

The image charge on the electrostatic information recording medium may also be reproduced in the form of information through an electrooptic crystal by applying laser light or the like from the electrostatic information recording medium electrode side, which is provided with an antireflection film. In this case, the electrostatic information recording medium needs to be formed from a transparent material. The electrooptic crystal is preferably disposed in the optical path, and it is preferable to use barium titanate, lithium tantalate ($LiTaO_3$), etc., which has an electrooptic effect, as an electrooptic crystal.

Figure 4:
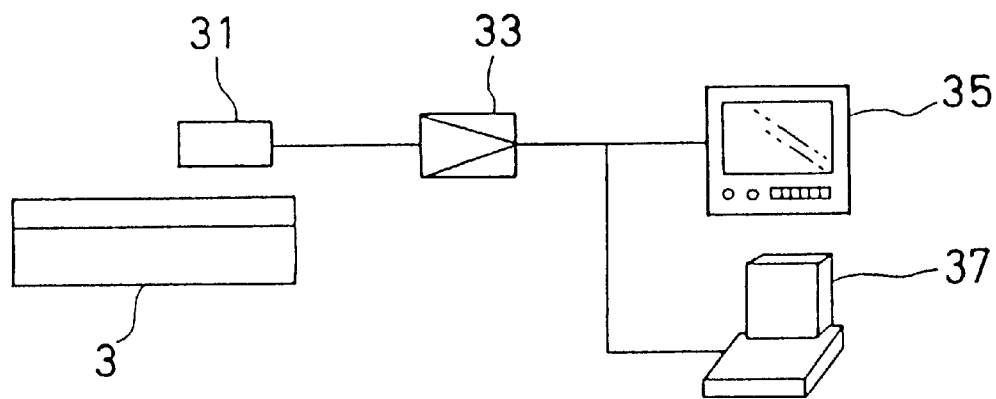
FIG. 4 schematically shows the arrangement of an electrostatic information recording and reproducing method.

FIG. 4 schematically shows an arrangement which may be employed to carry out the electrostatic information reproducing method. In the figure, reference numeral 31 denotes a potential reading unit, 33 an amplifier, 35 a CRT, and 37 a printer.

Referring to the figure, the charge potential is detected with the potential reading unit 31, and the detected output is amplified in the amplifier 33 and displayed on the CRT 35. It can also be printed out from the printer 37. In this case, it is possible to select any portion which is desired to read and to output the read potential at any desired time. It is also possible to reproduce the information repeatedly. Since the electrostatic latent image can be obtained in the form of an electric signal, it can also be utilized for, for example, recording onto another recording medium, if necessary.

Examples will be explained below.

EXAMPLE 1

On a glass substrate (1 mm in thickness) were provided an ITO transparent electrode of 1000 Å and a SiN insulating layer of 1000 Å by sputtering, and an amorphous silicon layer was stacked on the electrode to a layer thickness of 1.5 $\mu$m by plasma CVD under the following conditions, thereby forming a charge generation layer:

Conditions
  Gas: 10% $SiH_4$ diluted in $H_2$
  Flow rate: 80 cc/min
  Substrate temperature: 250° C.
  High-frequency voltage: 100 W (13.56 MHz)
  Degree of vacuum: 0.1 Torr
  Distance between electrodes: 5 cm
  Deposition time: 2 hr Next, an a-Si layer was stacked on the amorphous selenium layer to 20 $\mu$m by vacuum evaporation ($10^{-5}$ Torr;

resistive heating) to form a charge transport layer, thereby preparing a photosensitive member.

Meantime, a silicone resin solution (TSR-144, CR-15, 1%; manufactured by Toshiba Silicone Co., Ltd.) was coated by spinner coaring (1000 rpm×30 s) on a glass substrate (1 mm in thickness) having Al evaporated thereon to 1000 Å and then dried for 1 hour at 150° C., thereby preparing an electrostatic information recording medium having a charge retaining layer with a layer thickness of 7 µm.

The photosensitive member and the electrostatic information recording medium were placed face-to-face with each other across an air gap of 10 µm that was defined by a space comprising a PET film of 10 µm thick. In a state where a voltage of 750 V was applied between the two electrodes with the ITO side being defined as a positive electrode, pattern exposure was carried out with light from a 10 lux halogen lamp. At the same time as the exposure finished, the voltage was cut off.

After the exposure, the electrostatic information recording medium was taken out, and the surface potential was measured. The potential at the exposed region was +350 V, while the potential at the unexposed region was +130 V.

EXAMPLE 2

A mixture of polyvinylcarbazole (manufactured by Anan K.K.) and 2,4,7-trinitrofluorenone (manufactured by Tokyo Kasei Kogyo K.K.) in the molar ratio of 1:1 was coated on the amorphous silicon layer in Example 1 with a doctor blade (gap width: 200 µm) by use of a 5 wt % (solid content) chloroform solution and then dried for 1 hour at 60° C. to form a charge transport layer of 15 µm thick, thereby preparing a photosensitive member.

Electrostatic information recording was conducted using the same electrostatic information recording medium as that employed in Example 1 and in the same way as in Example 1 except that the polarity of the applied voltage was opposite to that in Example 1, and the surface potential was measured. The potential at the exposed region was −400 V, while the potential at the unexposed region was −110 V.

Comparative Example

Electrostatic information recording was conducted in the same way as in Example 2 except for the use of a 10 µm photosensitive member having only an amorphous silicon layer (non-doped) as a photoconductive layer. The potential at the exposed region of the electrostatic information recording medium was −450 V, while the potential at the unexposed region was −440 V. Thus, the contrast ratio of the exposed region to the unexposed region was low. In other words, the resulting image was not clear.

In the next place, the second to eighth photosensitive members will be explained. It should be noted that in these photosensitive members, the photosensitive member structure, electrostatic information recording medium, electrostatic information recording method, etc., which have been described in regard to the first photosensitive member, are used in the same way unless otherwise specified.

The second photosensitive member will be explained below.

Referring to FIG. 5, which is a sectional view of this photosensitive member, reference numeral 205 denotes a substrate, 207 an electrode, 208 an insulating layer, and 209 a photoconductive layer.

The photosensitive member is formed by stacking the insulating layer 208, serving as a blocking layer of charge injection from electrode, on the transparent electrode layer 207 stacked on the transparent substrate 205, and then stacking the photoconductive layer 209, having a photoelectric multiplication effect, on the insulating layer.

Examples of materials which are usable to form a photoconductive layer having a photoelectric multiplication effect are inorganic photoconductive materials, e.g., amorphous selenium, amorphous silicon, cadmium sulfide, zinc oxide, etc., organic photoconductive materials, e.g., oxadiazole, hydrazone, pyrazoline, polyvinylcarbazole, carbazole, stilbene, anthracene, naphthalene, tridiphenylmethane, azine, amine, aromatic amine, etc., and complexes, e.g., polyvinylcarbazole-trinitrofluorenone.

If amorphous selenium is used, for example, it is preferable to add from 1 wt % to 50 wt % of tellurium or the like to selenium for the purpose of sensitization of wavelength. To allow selenium to contain tellurium, it is possible to adopt a multiple evaporation process in which the components are simultaneously evaporated with the component ratio being controlled, or an evaporation process that uses an alloy of selenium. It is also preferable to allow selenium to contain from 0.1 wt % to 30 wt % of arsenic or the like in order to prevent crystallization of selenium. The photoconductive layer having a photoelectric multiplication effect is preferably stacked with a film thickness of from 1 to 30 µm.

The insulating layer 208 comprises one or plurality of stacked layers formed by EB evaporation, sputtering, etc. from an inorganic metal oxide, e.g., $GeO_2$, $CeO_2$, $SiO_2$, $Al_2O_3$, $WO_3$, etc., or an inorganic insulating material, e.g., SiN, SiC, etc. in the film thickness range of from 100 Å to 1000 Å. The insulating layer is provided in order to prevent dark current, but it need not be provided in a case where it is unnecessary to prevent dark current, for example, in a case where a blocking contact is formed between the photoconductive layer and the electrode with the polarity that is employed at the time of exposure under the application of a voltage, or in a case where it suffices to obtain a difference between dark and light regions even if a dark current flows. In such a case, the photoconductive layer having a photoelectric multiplication effect is provided directly on the electrode substrate.

The photosensitive member thus formed necessitates application of a high voltage between the respective electrodes of the photosensitive member and the electrostatic information recording medium, which are disposed face-to-face with each other, so that a predetermined electric field intensity is obtained at the photosensitive member. By doing so, it is possible to cause a so-called avalanche effect (electron avalanche effect) in the photoconductive layer (having a dielectric constant of about 7). It is necessary in order to cause an avalanche effect to apply a voltage that provides a field intensity of from $5 \times 10^5$ V/cm to $5 \times 10^6$ V/cm at the photosensitive member in the case of an amorphous selenium layer, for example. When the photosensitive member and the electrostatic information recording medium are disposed face-to-face with each other across an air gap, it is necessary to control the voltage between the two electrodes so that an avalanche effect occurs in the photosensitive member by taking into consideration the voltage distribution among the electrostatic information recording medium, the insulating layer and the air gap. Examples will be explained below.

EXAMPLE 3

On a glass substrate (1 mm in thickness), the $SnO_2$ transparent electrode of 1000 Å by sputtering was provided.

On the electrode a germanium oxide layer of 100 Å and then a cesium oxide layer of 100 Å by EB evaporation, thereby forming a charge injection preventing layer, were formed. Amorphous selenium was stacked thereon to a film thickness of 1 μm by vacuum evaporation to prepare a photosensitive member.

Meantime, a fluorocarbon resin solution (Cytop; manufactured by Asahi Glass Company, Ltd.) was coated by spinner coating (1000 rpm×30 s) on a glass substrate (1 mm in thickness) having Al evaporated thereon to a thickness of 1000 Å and then dried for 1 hour at 150° C., thereby preparing electrostatic information recording medium having a charge retaining layer with a film thickness of 1 μm.

The photosensitive member thus prepared and the electrostatic information recording medium were placed face-to-face with each other across an air gap, which was changed as shown in the table below, the air gap being defined by a spacer comprising a PET film. While a voltage of 750 V was applied between the two electrodes for 1/500 second with the photosensitive member electrode side being defined as a positive electrode, pattern exposure was carried out with light from a 10 lux halogen lamp.

| Air gap (μm) | Surface potential on charge retaining medium | | Voltage applied to photosensitive member |
| --- | --- | --- | --- |
| | Exposed region (V) | Unexposed region (V) | |
| 1.0 | 400 | 250 | 140V |
| 1.3 | 340 | 210 | 130V |
| 1.5 | 170 | 170 | 110V |
| 2.0 | 150 | 150 | 100V |

As is shows in the table, when the air gap was 1.0 and 1.3 μm, it was possible to observe a significant potential difference between the exposed region and the unexposed region, whereas, when the air gap was 1.5 μm and 2.0 μm, these two regions had the same potential on each occasion. As will be clear from the results, it has been revealed that, as the voltage applied to the selenium layer is increased, the amplification effect by virtue of which the surface potential at the exposed region becomes higher than that at the unexposed region appears above a certain threshold value.

Comparative Example

A solution of 5% polyvinylcarbazole (manufactured by Anan K.K.) in chloroform, containing 2,4,7-trinitrofluorenone in the equimolar ratio, was coated with a doctor blade of 4 mil on a substrate provided with the same electrode as that on the photosensitive member in the above-described Example 3, and then dried for 1 hour at 60° C., thereby preparing a photosensitive member with a film thickness of 10 μm. With this photosensitive member, electrostatic information recording was conducted in the same way as in Example 3.

Taking into consideration the polarity of the photoconductive layer of the photosensitive member, the recording was effected with the transparent electrode layer side being defined as a negative electrode. As a result, at the applied voltage with −700 V, the surface potential was −40 V throughout, and at the case of −1500 V, it was −120 V throughout. Thus, no difference was recognized between the exposed and unexposed regions.

EXAMPLE 4

A photosensitive member was prepared in the same way as in Example 3 except that selenium was evaporated directly on the electrode layer without providing a charge injection preventing layer, and electrostatic information recording was conducted in the same way as in Example 3. As a result, when the air gap 2 μm, a potential of +250 V was measured throughout, whereas, when the air gap was 1.3 μm, the surface potential at the unexposed region was +280 V, while the surface potential at the exposed region was +410 V. Thus, it was possible to obtain a contrast between the exposed and unexposed regions, although the background potential increased, and a sensitization effect was recognized.

The third photosensitive member will next be explained.

FIGS. 6(a) and 6(b) are sectional views of this photosensitive member, in which reference numeral 301 denotes a photosensitive member, 305 a substrate, 307 an electrode, 309 a black selenium layer, and 310 an antireflection layer.

As shown in FIG. 6(a), the third photosensitive member is formed by staking the black selenium layer 309 as a photoconductive layer on the electrode 307 by evaporation. In another form that is shown in FIG. 6(b), the third photosensitive member has the antireflection layer 310.

The black selenium layer and the method of forming it will be explained.

This photosensitive member is formed by evaporating selenium on the electrode layer under the conditions that the degree of vacuum is from $10^{-3}$ Torr to $10^{-6}$ Torr, the electrode layer temperature is from 80° C. to 120° C. and the evaporation rate is from 1 Å/sec to 100 Å/sec.

In the evaporation of selenium, the electrode layer temperature at the time when it is first evaporated on the electrode layer is important. In the evaporation, the electrode layer temperature is set in the range of from 100° C. to 120° C. and the evaporation rate is set in the range of from 1 Å/sec to 10 Å/sec. If the electrode layer temperature is lower than that, the deposited selenium layer becomes a red amorphous selenium (a-Se) layer, whereas, if it is higher than that, the resulting layer is a crystalline selenium layer.

If the evaporation rate is low, a longer time is required for the preparation, whereas, if it is high, the resulting layer readily seperates from the electrode layer, unfavorably. By setting the evaporation rate so as to be conformable to the above-described condition, it is possible to form a black selenium layer with high efficiency.

It should be noted that, once a black selenium layer is formed, it is continuously formed even if the electrode layer temperature is lowered or the evaporation rate is increased.

The physical properties of black selenium are more approximate to those of a-Se than those of crystalline selenium. Although the details of the morphology are unknown, the selenium layer that is formed by the above-described method shows a black color, whereas a-Se shows a red color. In comparison of the infrared absorption spectrum of black selenium with that of a-Se, it is revealed that black selenium absorbs well even light in the wavelength range of from 600 to 800 nm, whereas a-Se absorbs light below 630 nm in wavelength.

Although the foregoing description has been made with regard to the photoconductive layer, it should be noted that in this photosensitive member, a discharge intensifying layer may be provided on the photoconductive layer in the same way as in the case of the first photosensitive member in terms of the material and method for forming it, and it is also possible to employ the same electrode material, substrate material, electrostatic information recording, etc. as those which have been described in connection with the first photosensitive member.

Examples will be explained below.

EXAMPLE 5

Corning 7059 glass (23 mm×16 mm×0.9 t, optically polished) having a thin transparent $SnO_2$ electrode layer provided on one surface thereof is subjected to ultrasonic cleaning in trichloroethane, acetone and ethanol in the mentioned order for 10 minutes respectively.

After the cleaned substrate has been set on a substrate heater inside a vacuum chamber in such a manner that satisfactory heat conduction will be available, the inside of the reaction chamber is evacuated to $10^{-5}$ Torr.
(Deposition of black selenium layer)

Next, the electrode layer is heated to 120° C. by resistive heating. The evaporation of selenium was conducted by an ordinary resistive heating process under the conditions that the degree of vacuum was $1\times10^{-5}$ Torr, selenium particles were used as an evaporation material, the evaporation rate was 5 Å/sec and the evaporation time was 5 hours, thereby stacking a selenium layer with a film thickness of 10 $\mu$m, and thus preparing a photosensitive member.

The selenium layer thus formed was black.

In the above-described example, selenium evaporation was also conducted under the conditions that the evaporation rate was 5 Å/sec and the evaporation time was 30 minutes to evaporate selenium to a film thickness of 1 $\mu$m, and then the electrode layer heating temperature was lowered to 90° C. and, in this state, evaporation was conducted under the conditions that the evaporation rate was 50 Å/sec and the evaporation time was 30 minutes to evaporate selenium to a film thickness of 9 $\mu$m. In this case also, a selenium layer which was similar to the above was obtained.

It should be noted that an evaporation apparatus manufactured by Japan Electron Optics Laboratory Co., Ltd. was used for the evaporation and the electrode layer was heated by resistive heating using a flat heater (manufactured by Hanawa Netsuden) with minimal in-plane temperature distribution. The temperature of the electrode layer was measured from the reverse side of the substrate by use of a chromel-alumel thermocouple.

Comparative Example

A photosensitive member was prepared in the same way as in the above-described example except that selenium was evaporated on the electrode layer that was not heated. The stacked selenium layer was red and therefore identified as an a-Se layer.

A photosensitive member was prepared in the same way as in the above-described example except that selenium was evaporated on the electrode layer that was heated to 150° C. The stacked selenium layer was gray and therefore identified as a metallic Se layer.

EXAMPLE 6

The xerographic characteristics of the photosensitive member prepared in the above-decribed example and the photosensitive member with an a-Se layer prepared in the above-described comparative example were measured.

Figure 7A:
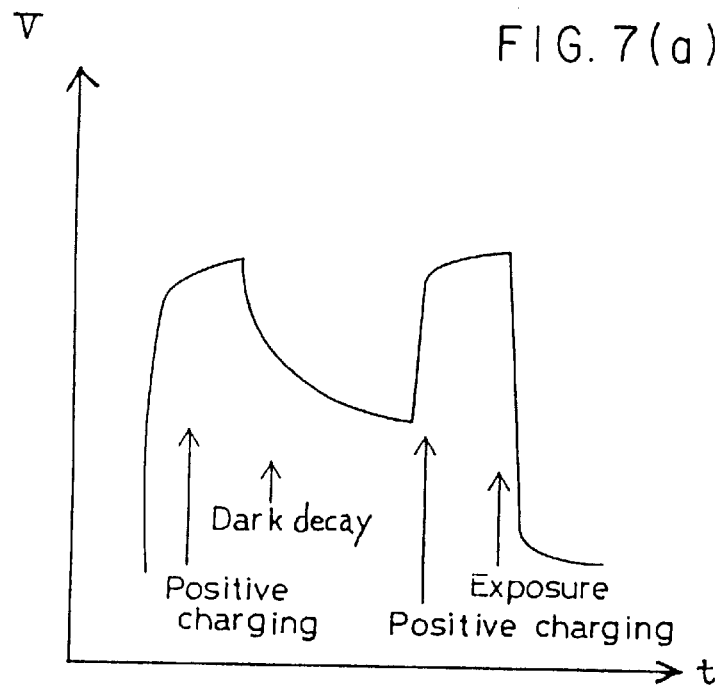
FIGS. 7a and 7b are graphs showing xerographic characteristics of the third photosensitive member.
Figure 7B:
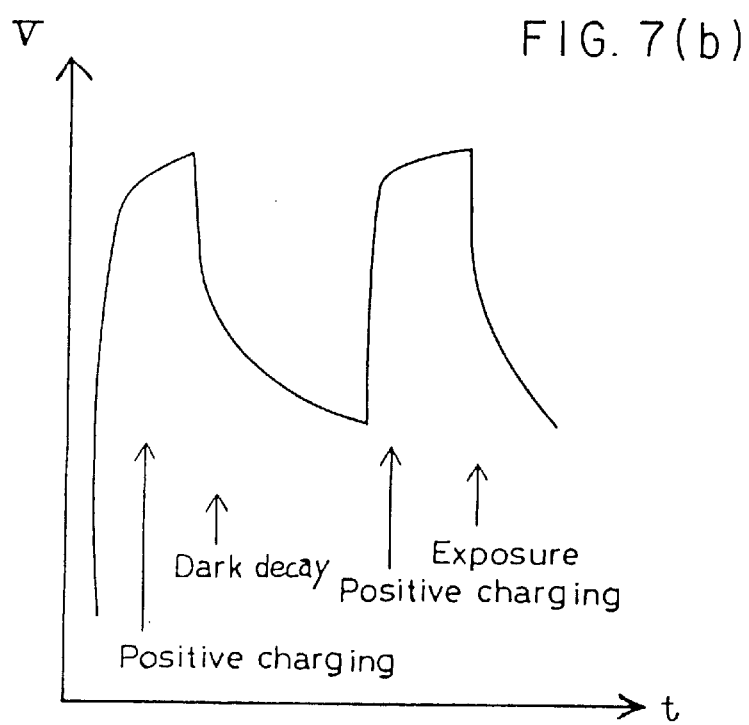

The xerographic characteristics were measured on the basis of the difference between the degree of dark decay of the surface potential after the whole photoconductive layer has been charged by corona charging and the degree of photodecay by the exposure with red light of 650 nm. FIG. 7(a) shows the xerographic characteristics of the photosensitive member according to the present invention, and FIG. 7(b) shows the xerographic characteristics of the a-Se photosensitive member prepared in the comparative example.

It will be Understood from the figures that the photosensitive member of the present invention exhibits a clear difference between the dark decay and the photodecay by the exposure in comparison to the photosensitive member having an a-Se layer stacked thereon.

Figure 8:
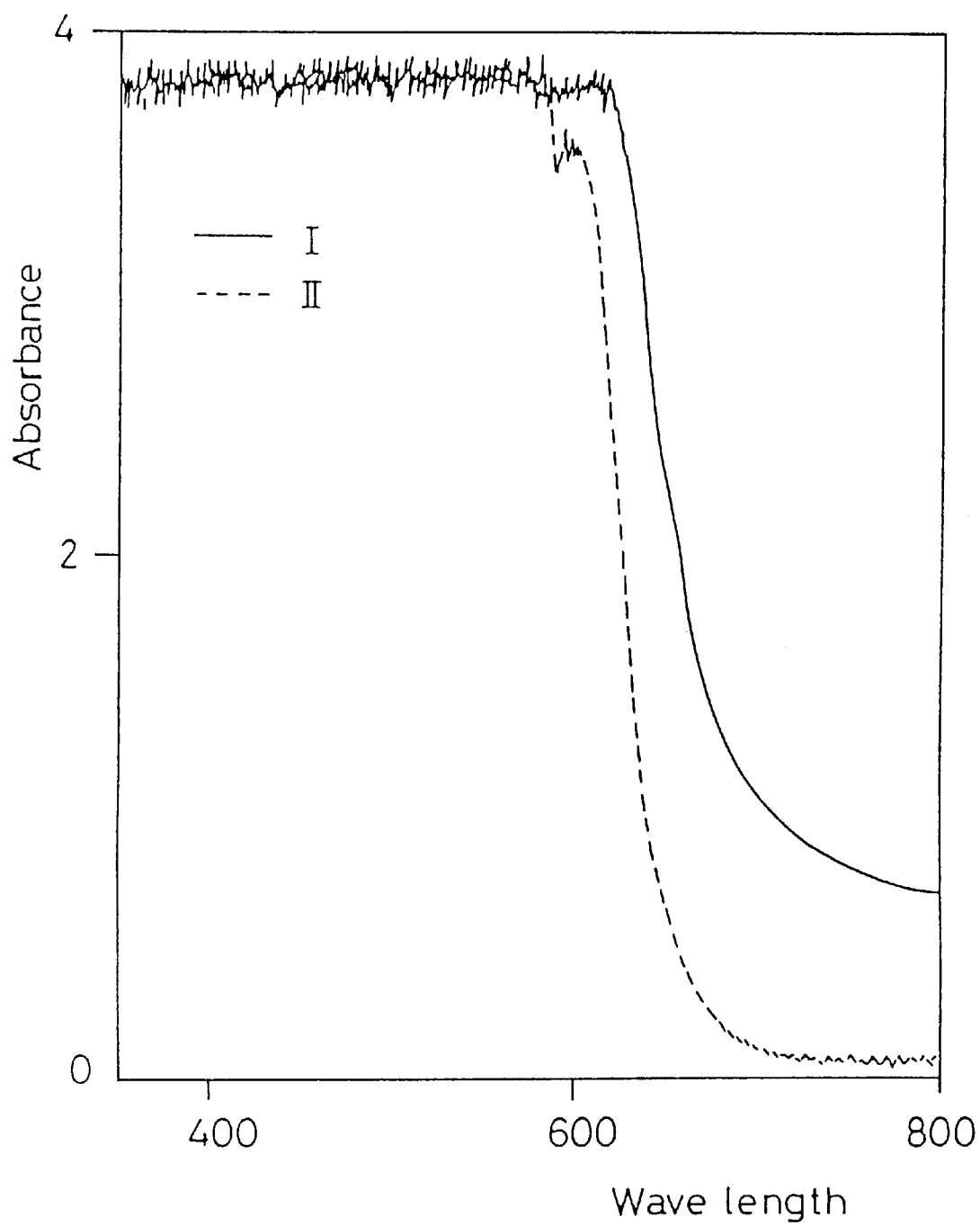
FIG. 8 is a graph showing the light absorption spectra of black selenium and a-selenium.

FIG. 8 shows the results of the measurement of the absorbance of the photosensitive member according to the present invention and the a-Se photosensitive member prepared in the comparative example.

It will be understood from the figure that the photosensitive member (I) of the present invention has excellent absorption characteristics particularly in the long-wavelength region in comparison to the a-Se photosensitive member (II) prepared in the comparative example.

Figure 9:
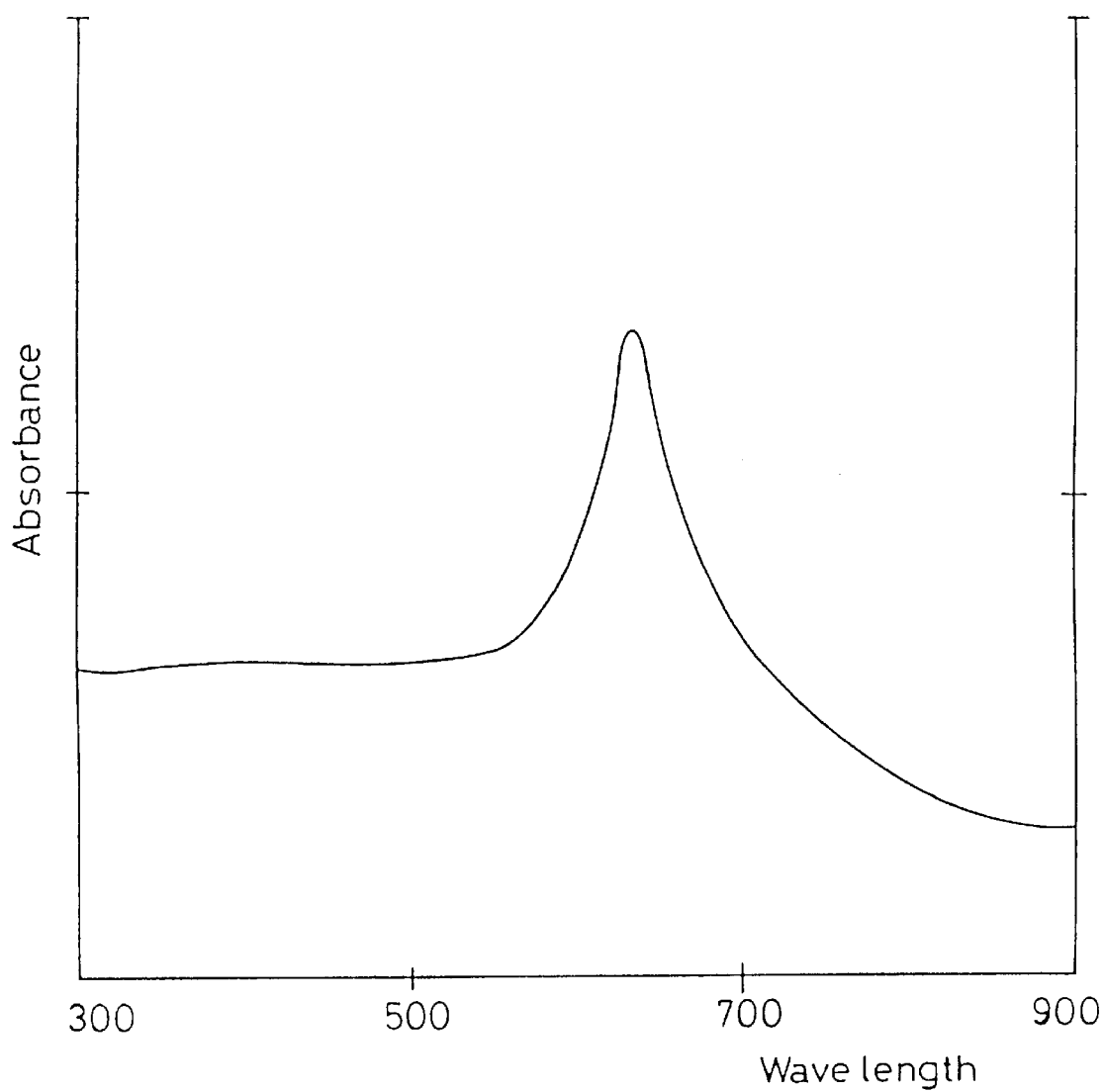
FIG. 9 is a graph showing the light absorption spectrum of metallic selenium.

FIG. 9 shows the absorption spectral characteristics of the deposited metallic selenium film. It will be understood that the black selenium layer in the present invention is not a metallic selenium layer.

EXAMPLE 7
(Preparation of electrostatic information recording medium)

On a glass substrate of 1 mm thickness was stacked an Al electrode to a film thickness of 1000 Å by vacuum evaporation ($10^{-5}$ Torr). On the Al electrode was stacked a film of about 10 $\mu$m thick using chlorotrifluoroethylene powder (trade name: CTFE, manufactured by Asahi Glass Company, Ltd.; glass transition temperature: 108° C.; water absorption: 0.01%; and resistivity: $1\times10^{18}$ ohm-cm) by vacuum evaporation ($10^{-5}$ Torr) under the conditions that the evaproation rate was from 0.8 to 1.8 $\mu$m/min and the electrode substrate temperature was room temperature, under heating to 105° C. by resistive heating, thereby preparing an electrostatic information recording medium.

The electrostatic information recording medium and each of the photosensitive members prepared in Example 5 and comparative example were disposed face-to-face with each other across a spacer of a polyester film with a thickness of 10 $\mu$m, and a DC voltage of +700 V was applied between the two electrodes, with the photosensitive member side being set positively, and the charge retaining layer side negatively.

With the voltage being applied, the photosensitive member was exposed for 1 second with red light of 650 nm in wavelength to form an electrostatic latent image on the charge retaining layer. Thereafter, the electrostatic information recording medium was taken out.

The surface potential on the electrostatic information recording medium was measured with a surface potential sensor. When the photosensitive member prepared in example 5 was used, a surface potential of 350 V was measured, whereas, when the photosensitive member prepared in comparative example was used, only a surface potential of 100 V was observed.

Thus, it will be understood that the electrostatic information recording method that uses the photosensitive member of the present invention has excellent photosensitive characteristics in the long-wavelength region.

The fourth photosensitive member will next be explained.

Figure 10A:
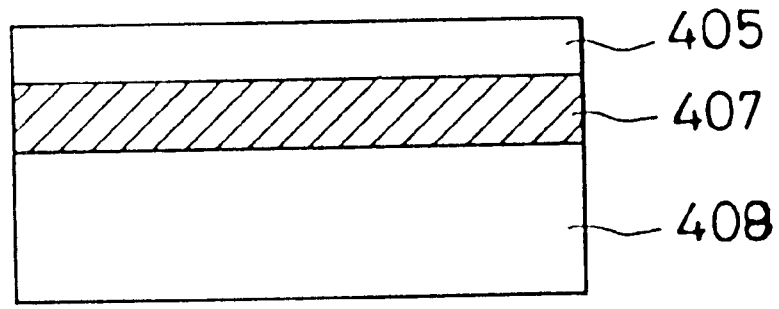
FIGS. 10a and 10b are sectional views of a fourth photosensitive member.
Figure 10B:
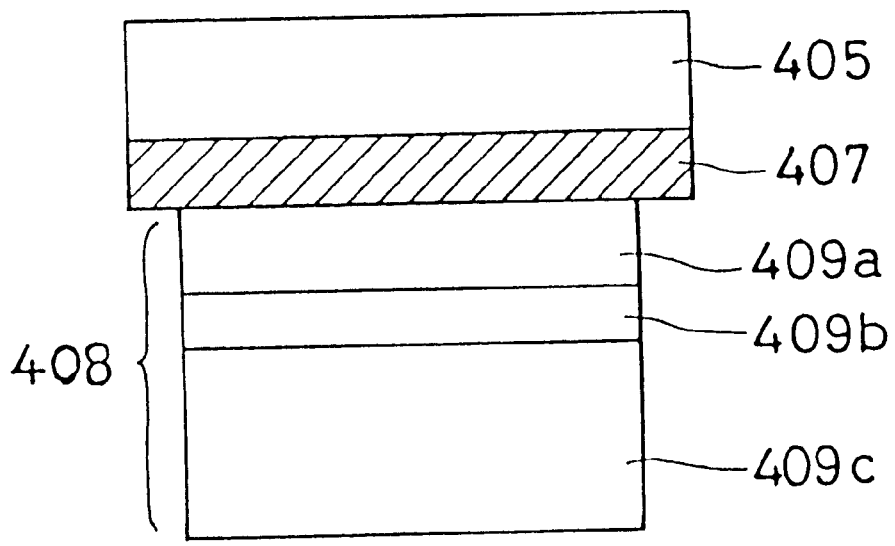

FIGS. 10(a) and 10(b) are sectional views of the fourth photosensitive member, in which reference numeral 405 denotes a substrate, 407 an electrode, 408 a photoconductive layer, 409a an emitter layer, 409b a base layer, and 409c a collector layer.

In the photosensitive member that is shown in FIG. 10(a), the effect of increasing the injection efficiency of an electric carrier of the same polarity as that of the electrode is continuously produced under the application of a voltage even after the exposure. This photosensitive member is formed by stacking on an electrode substrate a photoconductive layer having the photo-induced memory effect.

A photoconductive layer of a photosensitive member is a semiconductive layer in which, when it is exposed, photo-carriers (electrons or holes) are generated in the exposed region and these carriers are movable across the width of the layer. This effect is particularly remarkable in the presence of an electric field. In the fourth photosensitive member, the photoconductive layer has the photo-induced memory effect (light fatigue effect). More specifically, when made conductive by exposure, the photoconductive layer enables the charge injection from the electrode to continue even after exposure as long as the applied voltage is continued, thus making it possible to obtain an amplifying effect in accordance with the amount of exposure.

Examples of photosensitive materials having the photo-induced memory effect include polyvinylcarbazole (PVK). If a PVK layer is formed on an ITO electrode to prepare a photosensitive member and ultraviolet light is applied to the photosensitive member under the applied voltage, radicals are formed in the PVK layer, resulting in an increase in the amount of charge injection from the electrode, and thus increasing the level of conductivity. This state lasts for several hours, and thus the photo-induced memory effect is exhibited. It should be noted that the photoconductive layer is capable of recovering to the previous insulator on heating for 1 second at 150° C.

If a spectroscopic sensitizer, for example, a triphenylmethane dye, is added to PVK, excitation occurs at the absorption wavelength of the dye, and the excitation energy causes an interaction between it and the PVK, thereby enabling radicals to be generated in the dye or the PVK, and thus permitting exposure by visible light.

Such a photosensitive material having the photo-induced memory effect comprises a charge transport material and a specific dye and binder. Examples of charge transport materials usable for this purpose are azo-compounds, bis-azo compounds, tris-azo compounds, phthalocyanine compounds, acid xanthene dyes, cyanine compounds, styryl dyestuffs, pyrylium dyestuffs, perylene compounds, methine compounds, a-Se, a-Si, azulenium salts, and squalium salts.

As to dyes, it is possible to use those which are represented by the general formula:

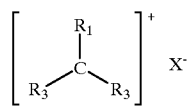

(in the formula, at least one of the radicals $R_1$, $R_2$ and $R_3$ is a phenyl radical substituted by N at the para position, which is represented by the following formula (1) or (2):

(1)

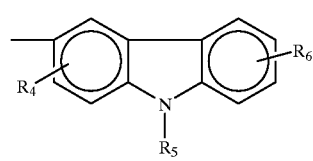

(2)

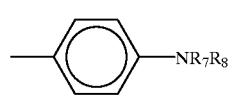

(in the formulae, $R_4$ to $R_8$ are each an alkyl radical, aryl radical or hydrogen)
one or two of the radicals $R_1$, $R_2$ and $R_3$ may be an alkyl, aryl or aralkyl radical, and X represents an anion)

Examples of usable binders are silicone, styrene-butadiene co-polymer, epoxy, acrylic, saturated or unsaturated polyester, polycarbonate, polyvinyl acetal, phenolic, polymethyl methacrylate (PMMA), melamine and polyimide resin materials.

The dye may be added to the charge transport material in the ratio of between 0.0001 and 0.1 mole, particularly preferably between 0.0003 and 0.003 mole, of the former to 1 mole of the latter. The binder is added to the charge transport material in the ratio of between 0.1 and 10 parts by weight of the former to 1 part by weight of the latter.

It is also possible to use an inorganic material, for example, zinc oxide, titanium oxide, etc.

The photoconductive layer having the photo-induced memory effect may be formed on the electrode substrate by coating, dipping, spinner coating, etc. The film thickness is preferably from 1 $\mu$m to 50 $\mu$m.

Since the charge injection efficiency of the photosensitive member having an optical memory function depends on the kind of electrode used even if the photoconductive material used is the same, it is necessary to select an electrode material having a high injection effectiveness in accordance with the photoconductive material used. It is preferable to employ a metal, for example, Zn, Ti, Fe, Sn, Cu, etc., or a semiconductor element, or an oxide semiconductor, for example, $SnO_2$, $In_2O_3$, ZnO, TiO, WO, $V_2O_5$, etc., alone or in the form of a composite material.

Next, in the photosensitive member that is shown in FIG. 10(b), a photoconductive layer is stacked in an nipin junction structure using amorphous silicon, thereby forming an emitter layer 409a (ni-layer), a base layer 409b (p-layer and a collector layer 409c (in-layer). Thus, as shown in FIG. 11, the energy barrier between the emitter and base is lowered only when exposure is carried out, to allow injection of charges from the electrode. As a result, an amount of charge which is greater than the amount of charge produced by light flows, thus obtaining a sensitization effect.

The method of forming this photosensitive member will be explained.

First of all, the ITO electrode 407 is formed on the transparent glass substrate 405, and then the emitter portion 409a is first formed on the electrode layer.

This emitter portion comprises a doped $n^+$-layer, a non-doped n-layer and a doped i-layer, which are successively deposited on the electrode layer in the mentioned order, the $n^+$-layer comprising an amorphous silicon hydride (a-Si:H) layer that is formed by plasma CVD using silane gas ($SiH_4$) diluted with hydrogen gas and also using phosphine ($PH_3$), and then doped with phosphorus atoms at 50 ppm, the n-layer comprising an a-Si:H layer that is non-doped, and the i-layer being formed by using $SiH_4$ diluted with hydrogen gas and also useing diborane ($B_2H_6$) and then doping boron into the resulting layer at 20 ppm.

The film thickness of each of these layers is about 0.05 $\mu$m.

The base portion 409b comprises a p-layer that is stacked on the emitter portion to a film thickness of 0.1 $\mu$m, the p-layer being formed by using $SiH_4$ diluted with hydrogen gas and also using $B_2H_6$ and then doping boron into the resulting layer at 100 ppm.

Further, the collector portion 409c comprises an i-layer of 20 $\mu$m thick, an n-layer of 0.1 $\mu$m thick and an n+-layer of 0.1 $\mu$m thick, which are successively stacked in the mentioned order, the i-layer being formed by using $SiH_4$ diluted with hydrogen gas and also using $B_2H_6$ and then doping boron into the resulting layer at 20 ppm, the n-layer comprising $SiH_4$ alone, and the $n^+$-layer being formed by using $SiH_4$ diluted with hydrogen gas and also using $PH_3$ and then doping phosphorus into the resulting layer at 50 ppm.

Figure 11A:
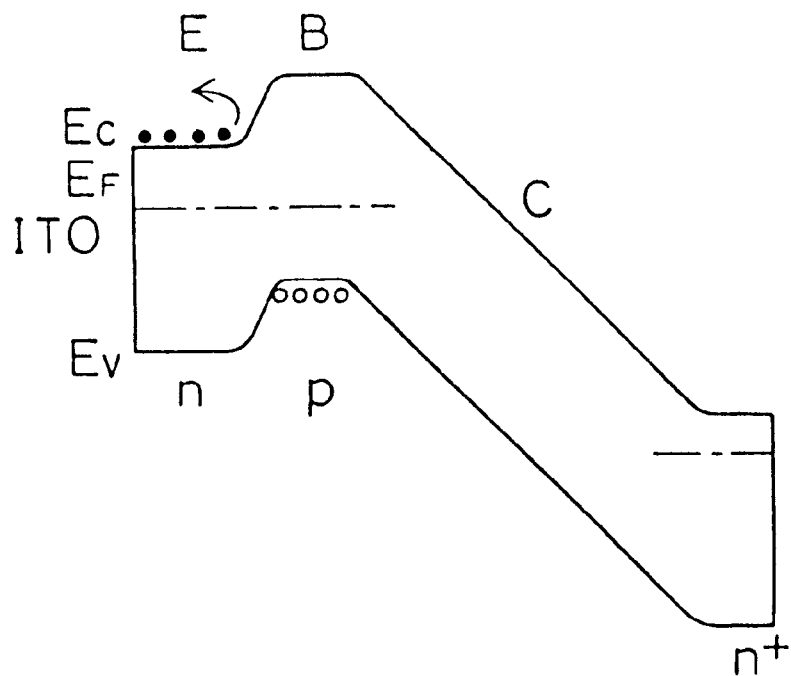
Figure 11B:
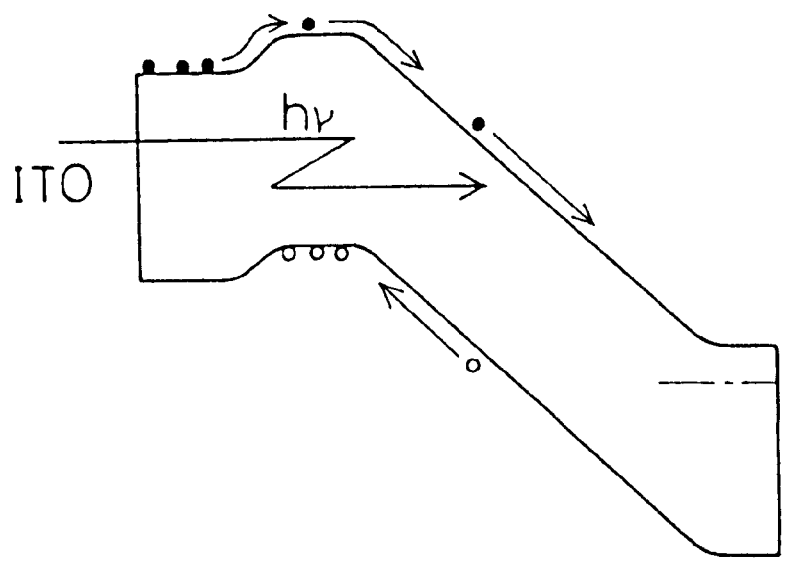

FIG. 11 illustrates the energy level in the photosensitive member that is formed in this way. FIG. 11(a) shows the energy level in the photosensitive member when it is placed in the dark, and FIG. 11(a) shows the energy level in the photosensitive member when it is exposed with light.

The photosensitive member and the electrostatic information recording medium, which are disposed face-to-face with each other, and a voltage is applied between the two electrodes with the photosensitive member electrode being set negative and the electrostatic information recording medium electrode positive. In a stage where no light is applied, the energy level is higher at the base side, and electrons that are injected from the electrode side are therefore blocked by the energy barrier that is formed between the emitter and the base, as shown in FIG. 11(a). However, when light is applied, light absorption occurs at the collector in accordance with the light energy, thus lowering the energy barrier formed between the emitter and the base. As a result, electrons are injected from the electrode in an amount corresponding to the light energy applied during the lifetime of electrons (or holes) generated by light, so that a number of electrons which is greater than the number of electrons generated by light flow through the layer, thus obaining an amplification effect. After the exposure, the energy barrier that is formed between the emitter and the base is restored to the previous state, and the injection of charges from the electrode therefore stops. In other words, charges are injected from the electrode while being amplified in accordance with the irradiated light only when light is applied.

Although the foregoing description has been made with regard to the photoconductive layer, it should be noted that in this photosensitive member, a discharge intensifying layer may be provided on the photoconductive layer in the same way as in the case of the first photosensitive member in terms of the material and method for forming it, and it is also possible to employ the same electrode material, substrate material, electrostatic information recording, etc. as those which have been described in connection with the first photosensitive member.

Examples will be explained below.

EXAMPLE 8

An ITO transparent electrode of 1000 Å was provided on a glass substrate (1 mm in thickness) by sputtering, and coating was applied to the electrode with a blade coater of 4 mil and using a 5% solution in chloroform of a mixture of polyvinylcarbazole (manufactured by Anan K.K.) and a carbazole dye (manufactured by Japanese Research Institute for Photosensitizing Dyes Co., LTD.) of the following formula in the molar ratio of 1:0.001:

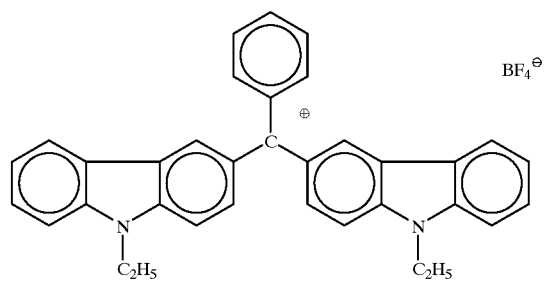

Then, the coating was dried for 1 hour at 60° C., thereby preparing a photosensitive member (10 μm in thickness).

Next, a glass substrate (1 mm in thickness) having Al deposited thereon to 1000 Å was coated with a silicone resin solution (TSR-144, CR-15, 1%; manufactured by Toshiba Silicone Co., Ltd.) by spinner coating (1000 rpm×30 s) and then dried for 1 hour at 150° C. to prepare an electrostatic information recording medium having a film thickness of 7 μm.

The photosensitive member and the electrostatic information recording medium, which were prepared in this way, were disposed face-to-face with each other across an air gap of 10 μm that was defined by a spacer comprising a PET film of 10 μm, and a voltage of 800 V was applied to the two electrodes with the ITO side electrode being defined as a positive electrode. In this state, pattern exposure was carried out for 1 second with halogen lamp light of 10 lux. At the same time as the exposure finished, the supply of the voltage was cut off.

After the exposure, the electrostatic information recording medium was taken out, and the surface potential thereof was measured. At the exposed region a potential of 280 V was measured, whereas, at the unexposed region the potential was 60 V.

In the meantime, with the same materials used, the application of the voltage was continued even after the exposure, and the supply of the voltage was cut off when 1 second had maintained after the exposure. Then, the surface potential of the electrostatic information recording medium was measured in the same way as the above. The potential at the exposed region was 450 V, while the potential at the unexposed region was 60 V. Thus, an increase in the potential at the exposed region was confirmed.

EXAMPLE 9

An ITO transparent electrode of 1000 Å was provided on a glass substrate (1 mm in thickness) by sputtering, and plasma CVD was carried out using silane gas and phosphine ($PH_3$) diluted with hydrogen to 1000 ppm and under the following conditions:

Substrate temperature: 250° C.

Input power: 1000 W, 13.56 MHz

Distance between electrodes: 5 cm

Substrate size: 3 inches in diameter

Gas flow rate: $SiH_4/H_2$ gas 100 cc/min
$PH_3/H_2$ gas 0.5 cc/min

Deposition time: 1 hr

Thus, an $n^+$-layer comprising amorphous silicon hydride (a-Si:H) doped with phosphorus at 50 ppm was deposited to 0.05 μm on the electrode.

Next, an n-layer comprising an a-Si:H layer alone was deposited to 0.05 μm by a similar process, using silane gas only, and further an i-layer doped with boron at 20 ppm was deposited to 0.05 μm by a similar process, using silane gas and 1000 ppm of diborane ($B_2H_6$) gas, thereby forming an emitter layer.

Next, a p-layer doped with boron at 100 ppm was deposited to 1.0 μm on the emitter layer by a similar process, using $SiH_4$ and $B_2H_6$ and under the condition that the deposition time was 2 hours, thereby forming a base layer.

Further, an i-layer doped with boron at 20 ppm was deposited to 15 μm by using $SiH_4$ and $B_2H_6$ and under the following conditions:

Gas flow rate: $SiH_4/H_2$ gas 250 cc/min
$B_2H_6/H_2$ gas 1 cc/min

Power: 150 W

Deposition time: 10 hr

Subsequently, an n-layer comprising a $SiH_4$ layer was deposited to 0.1 μm, and an n+-layer doped with phosphorus at 50 ppm was deposited to 0.1 µm by using SiH$_4$ and PH$_3$, thereby preparing a photosensitive member.

Next, this photosensitive member and the electrostatic information recording medium prepared in Example 8 were disposed face-to-face with each other across an air gap of 10 µm that was defined by a spacer comprising a PET film of 10 µm and a voltage of 750 V was applied to the two electrodes with the ITO side electrode being defined as a positive electrode. In this state, pattern exposure was carried out for 1/500 second with halogen lamp light of 10 lux. At the same time as the exposure finished, the supply of the voltage was cut off.

After the exposure, the electrostatic information recording medium was taken out, and the surface potential thereof was measured. At the exposed region a potential of +380 V was measured, whereas, at the unexposed region, the potential was 150 V.

For the purpose of comparison, a photosensitive member was prepared by depositing only a collector layer on the ITO substrate by a similar plasma CVD process, the collector layer comprising an i-layer of 15 µm formed from B$_2$H$_6$/SiH$_4$=10 ppm, an n-layer of 0.1 µm formed from non-doped a-Si:H and an n$^+$-layer of 0.1 µm formed from PH$_3$/SiH$_4$=50 ppm. Then, an exposure experiment was conducted under the same conditions. As a result, on exposure for 1/500 second, only a potential of +150 V was obtained at the same level of the unexposed and exposed regions. Thus, it was proved that a sensitization effect was obtained with the layer arrangement of the Example.

The fifth photosensitive member will next be explained.

Figure 12A:
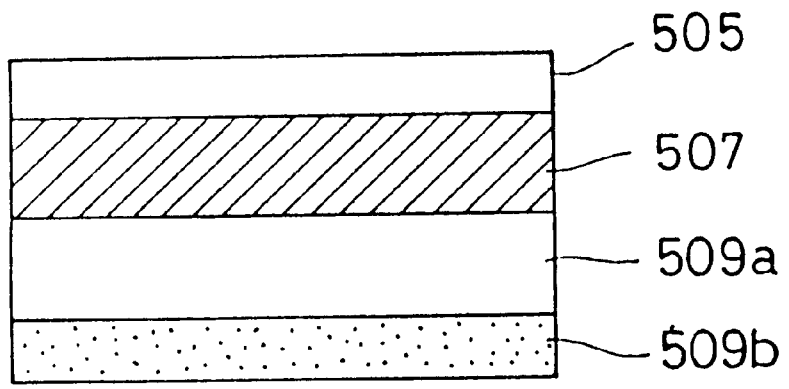
FIGS. 12a and 12b are sectional views of a fifth photosensitive member.
Figure 12B:
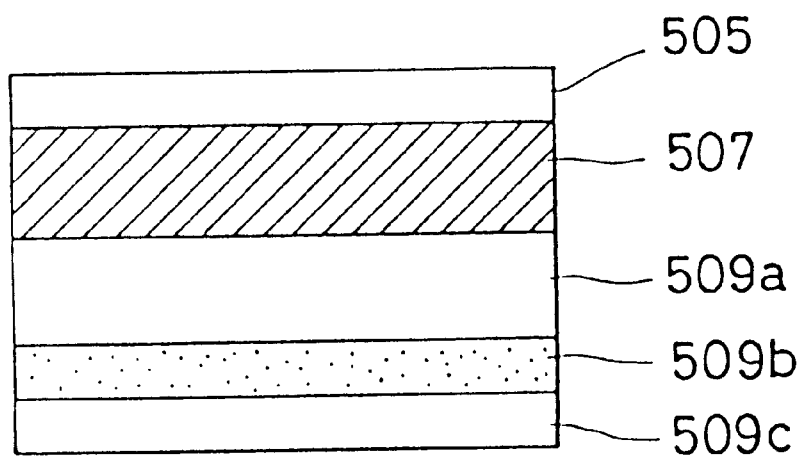

FIGS. 12(*a*) and 12(*b*) are sectional views of the photosensitive member according to the present invention, in which reference numeral 505 denotes a substrate, 507 an electrode, 509*a* photoconductive layer, 509*a* a selenium layer, 509*b* a bromine ion doped layer, and 509*c* a sodium ion doped layer.

This photosensitive member is formed by stacking the amorphous selenium layer 509*a*, as a photoconductive layer, on the transparent electrode layer 507 stacked on the transparent substrate 505 and then stacking a charge injection layer doped with bromine ions, as shown in FIG. 12(*a*).

The charge injection layer is formed by doping bromine ions, for example, into the surface of a deposited selenium layer at a concentration of from 10 ppm to 1000 ppm. The charge injection layer enables charges which are opposite in polarity to the electrode to be injected into the photoconductive layer when exposure is effected under the applied voltage. It is preferable to dope arsenic ions simultaneously with the above-described ion implantation with a view to preventing crystallization of the selenium layer.

The charge injection layer may have a double-layer structure that comprises a layer 509*b* having arsenic and bromine ions doped therein and a layer 509*c* having arsenic and sodium ions doped therein, as shown in FIG. 12(*b*).

In this photosensitive member, when exposure is carried out under the applied voltage, photocarriers (e.g., holes) are generated in the photoconductive layer, and these carriers are attracted by the electric field produced by the same and the electrostatic information recording medium to reach the charge injection layer, causing an electric discharge phenomenon in the air gap between the photosensitive member and the electrostatic information recording medium. At this time, an electric discharge which is greater than the number of photocarriers (e.g. holes) can be made to occur, so that image information can be recorded on the electrostatic information recording medium in an amplified form in accordance with the amount of exposure.

Although the foregoing description has been made with regard to the photoconductive layer, it should be noted that it is possible to employ the same electrode material, substrate material, electrostatic information recording method, etc. as those which have been described in connection with the first photosensitive member.

Examples will be explained below.

EXAMPLE 10

On a glass substrate (1 mm in thickness) was provided an ITO transparent electrode of 1000 Å by sputtering, and amorphous selenium with a film thickness of 20 µm was stacked on the electrode by vacuum evaporation. Then, bromine was doped into the amorphous selenium layer at 150 ppm by the method of ion plating, thereby preparing a photosensitive member according to the present invention.

In addition, a glass substrate (1 mm in thickness) having Al deposited thereon to 1000 Å was coated with a silicone resin solution (TSR-144, CR-15, 1%; manufactured by Toshiba Silicone Co., Ltd.) by spinner coating (1000 rpm× 30 s) and then dried for 1 hour at 150° C. to prepare an electrostatic information recording medium having a charge retaining layer with a film thickness of 7 µm.

The photosensitive member and the electrostatic information recording medium, which were prepared in this way, were disposed face-to-face with each other across an air gap of 10 µm that was defined by a spacer comprising a PET film of 10 µm, and a voltage of 750 V was applied to the two electrodes with the ITO side electrode being defined positively. In this state, pattern exposure was carried out for 1 second with halogen lamp light of 10 lux. At the same time as the exposure finished, the supply of the voltage was cut off.

After the exposure, the electrostatic information recording medium was taken out, and the surface potential thereof was measured. At the exposed region a potential of +260 V was measured, whereas, at the unexposed region the potential was +80 V.

Comparative Example

With the same electrode substrate as that used in Example 10, an amorphous slenium layer of 20 µm was similarly formed by evaporation, and then an As$_2$Se$_3$ compound was stacked thereon to a film thickness of 2 µm by evaporation, thereby preparing a photosensitive member.

With this photosensitive member used, electrostatic information recording was conducted in the same way as in Example 10. 140 V and 60 V were measured at the exposed and unexposed regions, respectively, of the electrostatic information recording medium.

Thus, it will be understood that, although Example 10 and Comparative Example differ from each other only in the surface structure of the photosensitive member, the photosensitive member of the present invention makes it possible to obtain a higher contrast potential between the exposed and unexposed regions of the electrostatic information recording medium for the same amount of exposure and it is therefore possible to achieve a highly sensitive photosensitive member.

The sixth photosensitive member will next be explained.

Figure 13:
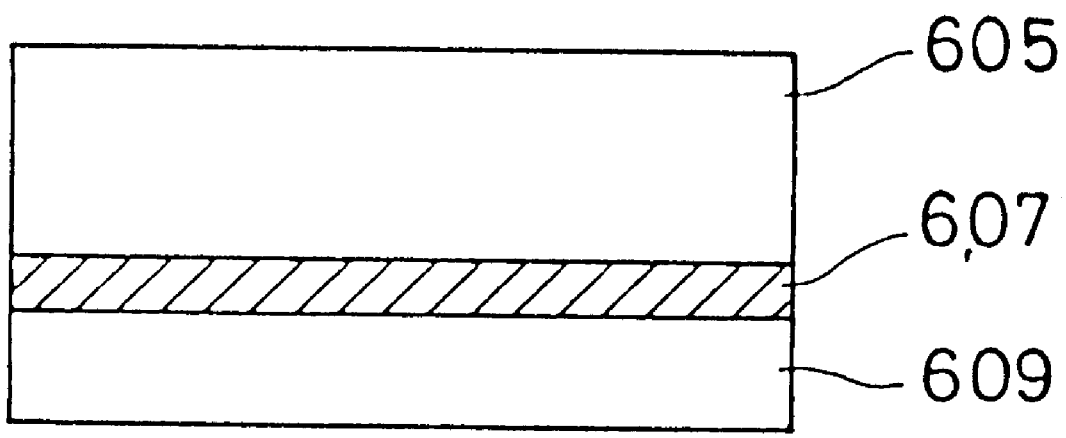
FIG. 13 is a sectional view of a sixth photosensitive member.

FIG. 13 is a sectional view of the photosensitive member, in which reference numeral 605 denotes a substrate, 607 an electrode, and 609 a photoconductive layer comprising a photoconductive fine particle dispersed layer.

As shown in the figure, this photosensitive member is formed by stacking a photoconductive fine particle dispersed layer, as the photoconductive layer 609, on the electrode 607. As the photoconductive fine particles, it is preferable to use crystalline-Se, a crystalline Se-Te mixture or a mixture or alloy of crystalline Se and, for example, As, Sb, Bi, etc., which is added for the purpose of sensitization. It is also possible to use crystalline photoconductive materials, e.g., CdS, PbO, alloys such as Zn-Te, Cd-Se, etc, or alloys of these materials. The particle diameter of fine particles used is preferably from 0.1 $\mu$m to 10 $\mu$m.

Examples of insulative binders into which photoconductive fine particles are dispersed are silicone, styrene-butadiene copolymer, epoxy, acrylic, saturated or unsaturated polyester, polycarbonate, polyvinyl acetal, phenolic, polymethyl methacrylate (PMMA), melamine and polyimide resin materials. From 0.1 to 10 parts of such a binder is added to 1 part of photoconductive fine particles with a view to facilitating the adhesion of the resulting layer to the electrode.

Examples of solvents usable to prepare a dispersion are KT-11 (a mixture of methyl ethyl ketone and toluene in the volume ratio of 1:1), trichloroethylene, tetrahydrofuran, butyl acetate, dichloromethane, ethanol, isopropanol, etc. A dispersion that is prepared using such a solvent may be coated on the electrode by use of spinner coating, blade coating, etc., thereby forming a layer.

The photoconductive fine particles are preferably mixed with the binder in the range of from 10 wt % to 75 wt %. If the photoconductive fine particle content exceeds 75 wt %, the resulting layer becomes conductive and has no insulating properties, unfavorably. If the photoconductive fine particle content is less than 10 wt %, the insulating properties become excessively high, so that the effectiveness that is provided by mixing of photoconductive fine particles is lost.

Although the foregoing description has been made with regard to the photoconductive layer, it should be noted that in this photosensitive member, a discharge intensifying layer may be provided on the photoconductive layer in the same way as in the case of the first photosensitive member in terms of the material and method for forming it, and it is also possible to employ the same electrode material, substrate material, electrostatic information recording method, etc. as those which have been described in connection with the first photosensitive member.

Examples will be explained below.

EXAMPLE 11

5 g of powdered crystalline selenium (manufactured by Furuuchi Kagaku K.K.; purity: 99.999%; and particle diameter: 300 Mesh), 8 g of an AS resin (Asahi Chemical Industry Co., Ltd.; trade name: Styrack) as a binder and 40 g of KT-11 (a mixture of methyl ethyl ketone and toluene in the volume ratio of 1:1) as a solvent were put in a mayonnaise bottle, and glass beads No. 1 were added thereto until the volume thereof accounted for about 80%. This was shaken for 5 hours with a shaker (Red Devil), thereby preparting a coating material.

The resulting coating material was applied to $In_2O_3$-$SnO_2$ glass which was 75 by 75 mm square with an applicator of 4 mil (gap: 100 $\mu$m), and this was dried to set in an oven for 2 hours at 60° C., thereby preparing a photosensitive member.

In the meantime, a silicone resin (TR-144, manufactured by Toshiba Silicone Co., Ltd.) was coated on an Al electrode to form a film of 10 $\mu$m thick, thereby preparing an electrostatic information recording medium.

The above-described photosensitive member and electrostatic information recording medium were disposed face-to-face each other across an air layer of 9 $\mu$m, and exposure was carried out with a voltage of 750 v being applied therebetween. As a result, a surface potential of 110 V was measured at the exposed region, whereas, a surface potential of 60 V was measured at the unexposed region. Thus, a clear charge image, which had a fine contrast voltage, was obtained.

EXAMPLE 12

12 g of powdered selenium mentioned in Example 11, 4 g of polycarbonate resin (trade name: Upiron E2000, manufactured by Mitsubishi Gas Kagaku) and 40 g of trichloroethylene (manufactured by Tokyo Kagaku) were put in a mayonnaise bottle and processed in the same way as in Example 11 to prepare a photosensitive member.

With this photosensitive member used, electrostatic information recording was conducted in the same way as in Example 11. As a result, a charge image having 180 V at the exposed region and 100 V at the unexposed region was obtained.

The seventh photosensitive member will next be explained.

Figure 14:
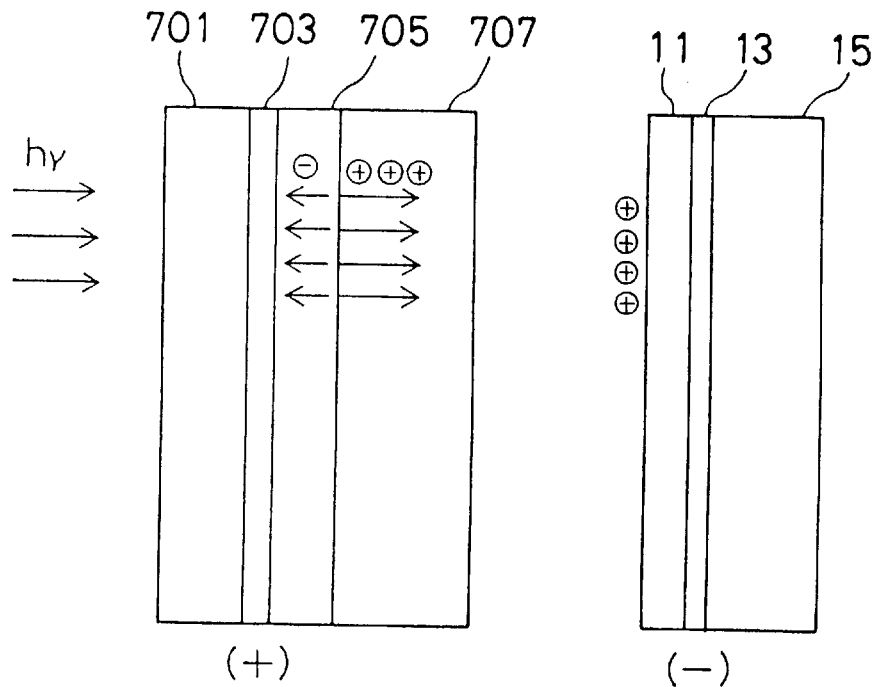
FIG. 14 shows a seventh photosensitive member and an electrostatic information recording method that uses the seventh photosensitive member.

FIG. 14 illustrates a recording method that uses this photosensitive member. In the figure, reference numeral 701 denotes a glass substrate, 703 an Au electrode, 705 a barrier modulation layer, 707 a photoconductive layer, 11 an insulating layer, 13 an electrode, and 15 a glass substrate.

In this photosensitive member, the Au electrode 703 that has a thickness of about 1000 Å and that is translucent is stacked on the glass substrate 701 that has a thickness of about 1 mm, and the barrier modulation layer 705 that has a thickness of several um is stacked on the electrode 703, thereby forming an Au-CdS diode. Further, the photoconductive layer 707 that has a thickness of about 10 $\mu$m is stacked on the Au-CdS diode to prepare a photosensitive member. The barrier modulation layer 705 is formed by doping Cu into CdS single crystal, for example.

An electrostatic information recording medium that comprises the insulating layer 11, the electrode 13 made, for example, of Al and the glass substrate 15 is disposed face-to-face with the photosensitive member across an air gap of about 10 $\mu$m. In this electrostatic information recording medium, the glass substrate has a thickness of about 1 mm. An Al electrode having a thickness of about 1000 Å is deposited on the glass substrate, and an insulating layer of about 10 $\mu$m is formed on the electrode.

Figure 15:
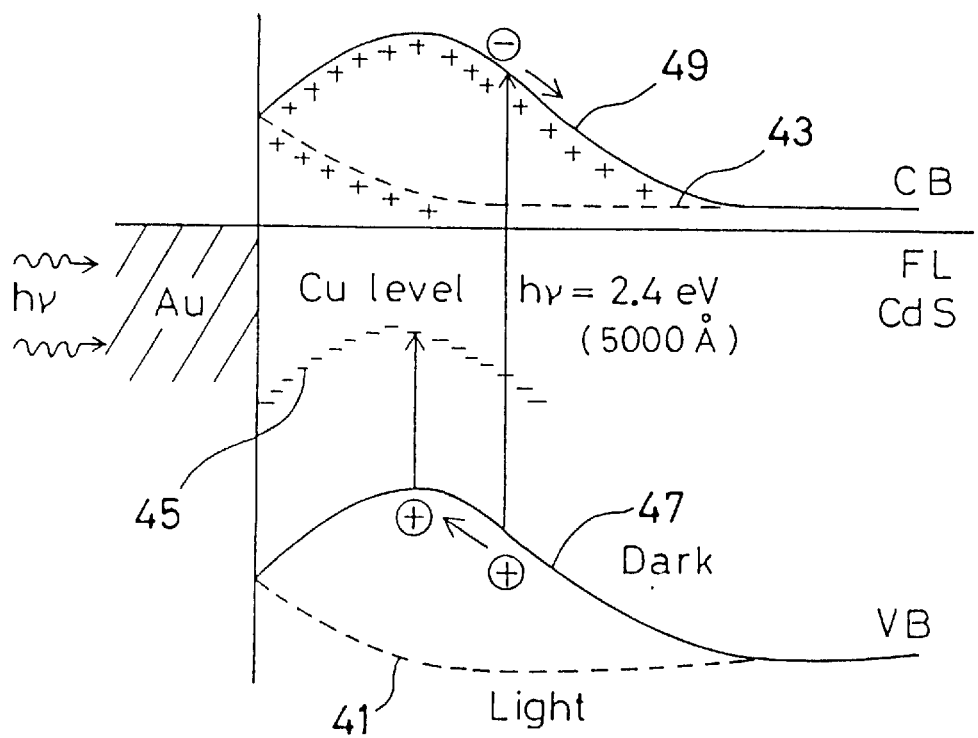
FIG. 15 is a graph showing changes in the current density when a voltage is applied to an Au-CdS diode.

FIG. 15 shows changes in the current density when a voltage is applied to the Au-CdS diode.

The chain lines 41 and 43 in the figure represent the energy levels of the valence and conduction bands, respectively, in CdS. The band gap is 2.4 eV. Accordingly, light in a wavelength band which is equal to or below 500 nm (5000 Å) is absorbed.

The chain line 45 represents the energy level of doped Cu, and the chain lines 47 and 49 represent the energy levels of the valence and conduction bands, respectively, in CdS that is doped with Cu.

When Cu is doped into CdS and diffused to a depth of from 0.1 to 0.2 $\mu$m, Cu becomes $Cu^-$ and forms an upward convex energy level that is represented by the chain line 45. As a result, the valence and conduction bands have respective upward convex portions, as shown by the solid lines 47 and 49, which act as a barrier between the Au and modulation layers. The presence of this barrier suppresses the dark current between the Au electrode 703 and the barrier modulation layer 705.

If, in this state, exposure is carried out from the side of the arrangement which is closer to the photosensitive member, as shown in FIG. 14, electron-hole pairs are generated in the barrier modulation layer 705 and the electrons and holes shift to the conduction and valence bands, respectively.

The holes shifting to the valence band are attracted by the electric field and move, as shown by the arrows, to combine with Cu$^-$, thereby canceling the same, and thus serving to lower the level of Cu$^-$. Accordingly, if exposure is effected with a sufficiently large amount of light, holes which are generated combine with Cu$^-$, so that the upward convex energy levels return to the previous states 41 and 43, resulting in the barrer being removed. Thus, there is no barrier between Au and CdS and the charge injection occurs simultaneously.

Thus, when no light is applied, the barrier modulation layer enables a barrier to be formed inside the photosensitive member to block the charge injection, thus cutting off the dark current, whereas, when light is applied, the barrier is removed, thus enabling the charge injection to occur simultaneously. In this way, the barrier modulation layer performs a function of switching the current in response to the irradiation with light.

Incidentally, in FIG. 15, holes that are generated by the irradiation with light act so as to remove the barrier but do not serve to transport charges.

In addition, the barrier modulation layer absorbs wavelengths of 500 nm or less but does not absorb light in a longer wavelength band than this. Therefore, by carrying out exposure with signal light and light in a longer wavelength band than 500 nm, which is superposed on the signal light, the barrier modulation layer is caused to perform a switching function by the signal light and the absorption of light of a longer wavelength than 500 nm is caused in the photoconductive layer 707 to generate carriers. In this case, the irradiation may be effected in such a manner that the signal light alone is modulated and the longer wavelength light is kept constant. Alternatively, both the signal light and the longer wavelength light may be modulated, or the longer wavelength light may be varied in accordance with the signal with the signal light being kept constant. In any case, an electrostatic latent image can be formed on the electrostatic information recording medium.

Among the carriers generated in this way, the electrons move toward the barrier modulation layer, whereas the holes move through the photoconductive layer and combine with (−) ions adsorbed on the surface through an air gap discharge, thus disappearing. As a result, the surface of the insulating layer 11 is charged with (+) ions in the air, thus forming an electrostatic latent image in accordance with the signal light.

Figure 16:
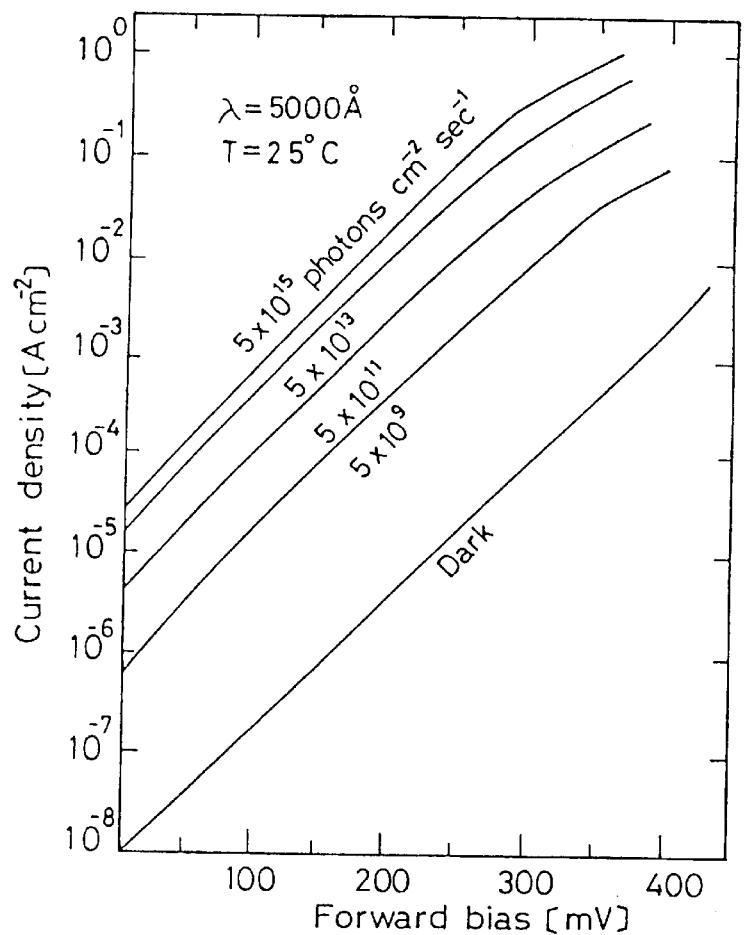
FIG. 16 is a graph showing the relationship between the forward bias voltage and the current density.

FIG. 16 is graph showing the relationship between the forward voltage and the current density when the barrier modulation layer was employed, with the amount of light irradiation being varied as a parameter under the conditions that the wavelength λ was 5000 Å and the temperature was 25° C.

It will be understood from the graph that the dark current is held down to a considerably low level by the switching function of the barrier modulation layer of Cu-doped CdS and the current varies with the amount of light irradiation.

Figure 17:
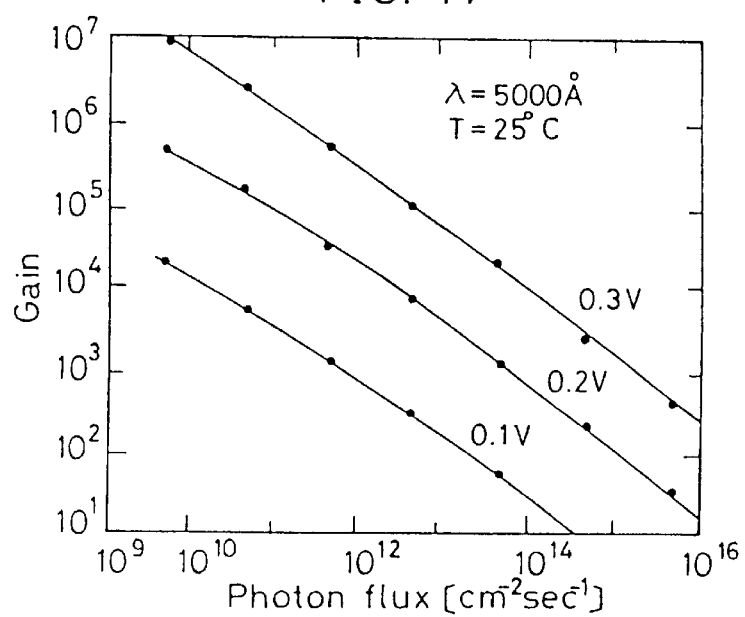
FIG. 17 is a graph showing the relationship between the light irradiation quantity and the gain under the condition that the wavelength λ is 5000 Å and the temperature is 25° C., with the forward voltage being employed as a parameter.

FIG. 17 is a graph showing the relationship between the amount of light irradiation and the gain, with the forward voltage being employed as a parameter under the conditions that the wavelength λ was 5000 Å and the temperature was 25° C. It will be understood from the graph that, as the applied voltage is increased, the gain increases.

Figure 18:
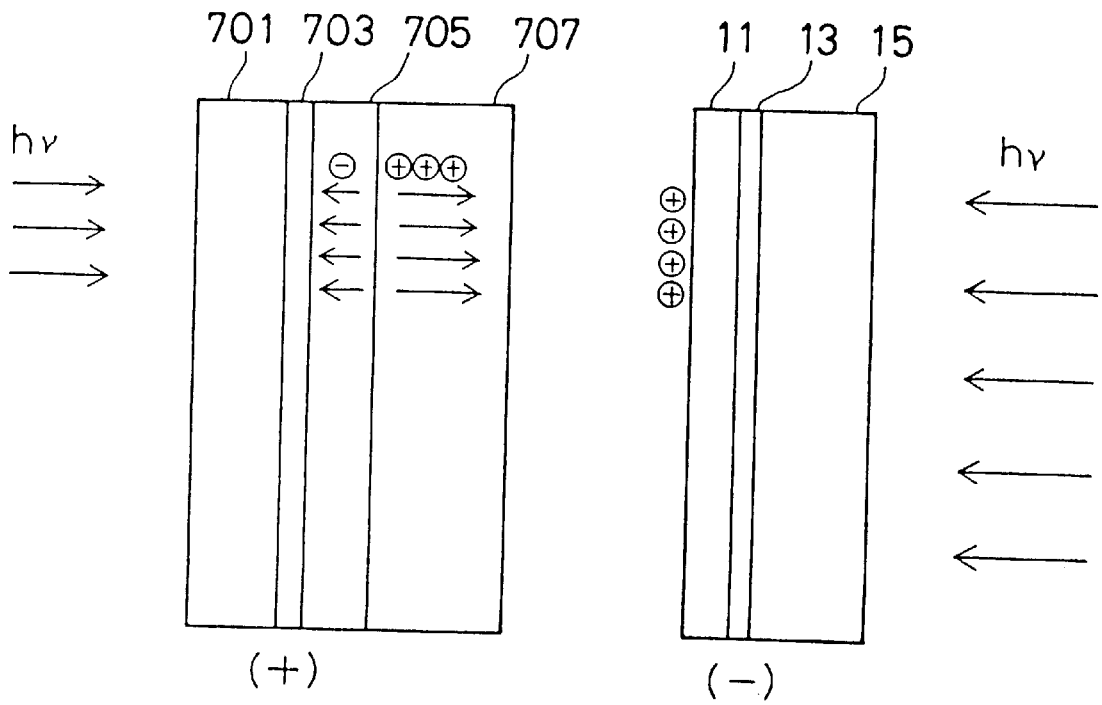
FIG. 18 shows another example of the seventh photosensitive member and an electrostatic information recording method that uses it.

FIG. 18 is a view showing another embodiment, in which the same reference numerals as those in FIG. 14 denote the same contents.

In this embodiment, exposure is effected with signal light from the photosensitive member side, and meantime, overall exposure is also effected from the electrostatic information recording medium side. The barrier modulation layer 705 is caused to perform a switching function by the exposure from the photosensitive member side, and at the same time, carriers are generated in the photoconductive layer 707 by the exposure from the electrostatic information recording medium side, thereby forming an electrostatic latent image on the electrostatic information recording medium 11.

In this case, when a predetermined voltage is applied between the electrodes 703 and 13, an electric discharge occurs in the air gap, so that (+) ions are adsorbed on the electrostatic information recording medium and (−) ions on the photosensitive member. As a result, an electric field that is produced by the adsorbed charges balances with an electric field that is produced in the air gap by the applied voltage, thus reaching a steady state. If, in this state, light is applied from either the photosensitive member side or the electrostatic information recording medium side, a number of holes which corresponds to the number of carriers generated in the photoconductive layer move to the surface of the photoconductive layer and combine with (−) ions adsorbed thereon, thereby generating a strong electric field between the photosensitive member and the electrostatic information recording medium, and thus causing the surface of the insulating layer 11 to be charged with (+) ions.

Examples will be explained below.

EXAMPLE 13

A CdS single crystal is cut along the c-axis into a size of 6.75 cm$^2$×1 mm. At this time, the doner concentration is $0.2 \times 10^{16}$ cm$^3$ and the mobility is 395 cm$^2$/V·sec (0.79 ohm-cm). The surface of the cut CdS single crystal is washed by dipping with 6HNO$_3$:6CH$_3$COOH:H$_2$O. Next, the surface is subjected to mechanical polishing and then chemical polishing by etching using 30% HCl. Upon completion of the washing of the surface, the surface into which Cu is to be doped is etched for 60 seconds with HCl:CH$_3$COOH:H$_2$O, and then subjected to dipping with $10^{-14}$ moles of CuCl$_2$ (in 4 mole hydrazine hydrochloride solution) and further subjected to bubbling for from 10 to 30 seconds with argon at 75° C., thereby making unifrom the contact with the surface.

In this way, Cu$_2$S is formed on the surface, with the degree of dipping being set at 100 Å or less. Next, the material is heated to 225° C. and then rapidly cooled to room temperature in from 20 to 40 seconds, thus causing Cu to be diffused to a depth of from 0.1 to 0.2 μm from the surface. After the diffusion of Cu, the surface is washed with a KCN solution (50 g/l) to remove the remaining Cu$_2$S, thus completing the preparation of a sample comprising Cu-doped CdS. Thereafter, an Au electrode is attached thereto.

The eighth photosensitive member will next be explained.

Figure 19:
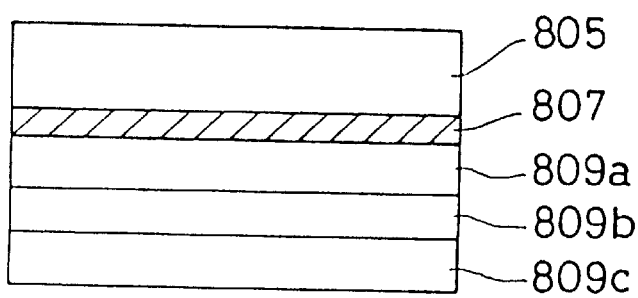
FIG. 19 is a sectional view of an eighth photosensitive member.

FIG. 19 is a sectional view of the photosensitive member, in which reference numeral 805 denotes a substrate, 807 an electrode, 809 a photoconductive layer, 809a a charge generation layer, 809b a super lattice APD layer, and 809c a charge transport layer.

This photosensitive member is formed by first stacking the charge generation layer 809a, which is a photoconductive material, on the electrode layer 807 that is stacked on the substrate 805, and then stacking the super lattice APD layer 809b having electron avalanche properties thereon and further stacking the charge transport layer 809c having charge transport properties on the super lattice APD layer.

The charge generation layer is made of a photoconductive material which has superior charge generating characteristics. Examples of photoconductive materials which are preferably used are amorphous silicon, amorphous selenium, organic photosensitive materials such as azo, dis-azo, tris-azo, azulenium salt and phthalocyanine pigment materials, and cyanine, styryl dyestuff, pyrylium dyestuff, perylene, methine and squalium salt dye materials.

To deposit an amorphous silicon, it is preferable to introduce silane gas, together with impurities (described later), if necessary, in a low vacuum (from $10^{-2}$ to 1 Torr) by glow discharge with or without heating, thereby depositing an amorphous silicon film on the electrode, or form an amorphous silicon film on the heated electrode by a thermochemical reaction, or form an amorphous silicon film by evaporation or sputtering using a solid raw material, in the form of either a single layer or a plurality of stacked layers.

When the polarity of the electrode is positive (+), it is preferable to provide a P-type charge generation layer, which transports holes, and boron, Al, Ga, In, Tl or the like is doped as the above-described impurities. When the polarity of the electrode is negative (-), it is preferable to provide an N-type charge generation layer, which transports electrons, and phosphorus, silver, antimony, bismuth or the like is doped. The layer may be employed without being doped.

To stack an organic photosensitive material, it is dissolved in a solvent together with a binder and the resulting solution is coated on the electrode by spinner coating, blade coating or the like.

Examples of usable binders are silicone, styrenebutadiene copolymer, epoxy, acrylic, saturated or unsaturated polyester, polycarbonate, polyvinyl acetal, phenolic, polymethyl methacrylate (PMMA), melamine and polyimide resin materials. From 0.1 to 10 parts of such a binder is added to 1 part of a charge generating material with a view to facilitating the adhesion of the resulting layer to the electrode.

A solvent which is preferably used depends on the kind of binder used and the kind of charge generating material used. It is, however, preferable to use a chlorine solvent (chloroform, dichloroethane, dichloromethane, etc.), THF, dioxane, toluene, MEK and alcohols alone or in the form of a mixture.

The super lattice APD layer, which is stacked on this charge generation layer, will be explained.

The super lattice APD layer is formed using a vertical super lattice APD or a horizontal super lattice APD, which has a rectangular or saw-tooth potential in its energy band diagram, as shown in FIG. 20.

In the case of a vertical super lattice APD, a two-component system composition which comprises, for example, Ga-As (As proportion: 50%), is formed to a film thickness of 450 Å, and a three-component system composition in which 45% of the Ga component in Ga-As is substituted by Al is stacked on the Ga-As layer to a film thickness of 550 Å. Further, this stack unit is periodically repeated 50 times to form an APD structure. If a voltage is applied across this structure with the Ga-As layer side being defined as a positive electrode and the Al-Ga-As layer side as a negative electrode, a pn junction is formed by each pair of adjacent Ga-As and Ga-Al-As layers, which are a pair of $n^+$- and $p^+$-layers.

By stacking this APD on the charge generation layer such that the $p^+$-layer side is in contact with the charge generation layer, it is possible to form a vertical APD layer according to the present invention.

Figure 20A:
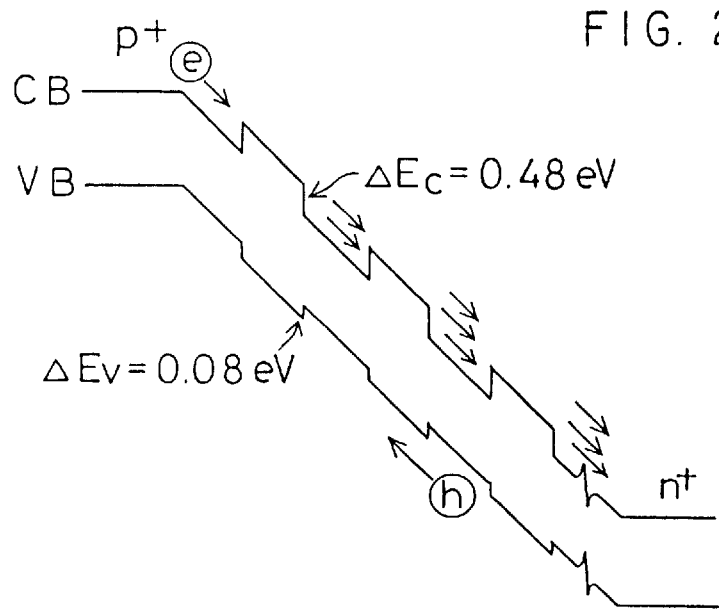
FIGS. 20a–20e show the energy band of a superlattice APD, which is a photoconductive layer, in the eighth photosensitive member.
Figure 20B:
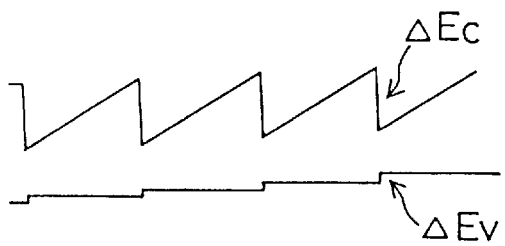

FIG. 20(a) shows the energy band diagram of this vertical super lattice APD.

The vertical super lattice APD has properties by virtue of which the energy slope of the pnp junction at the conduction band, which is formed in the direction of the film thickness when exposure is carried out with a voltage being applied between the electrode of the photosensitive member and the electrode of the electrostatic information recording medium, which faces the photosensitive member, with the former electrode being defined as a negative electrode and the latter as a positive electrode, can be made higher than the energy slope at the valence band. Although holes from the electrostatic information recording medium side are not accelerated, photoelectrons which are generated in the charge generation layer by the irradiation with light are accelerated by the electric field in the film thickness direction by virtue of the slope, causing an electron avalanche phenomenon, so that the light carriers are amplified to 20 times or more as they move through the interlayers of the APD layer.

In the vertical super lattaice APD, if the concentration gradient of Al in each $p^+$layer thereof is continuousaly raised from 0 to 45% in the film thickness direction from the charge generation layer side, the energy barrier at the conduction band can be formed into a saw-tooth shape.

Figure 20C:
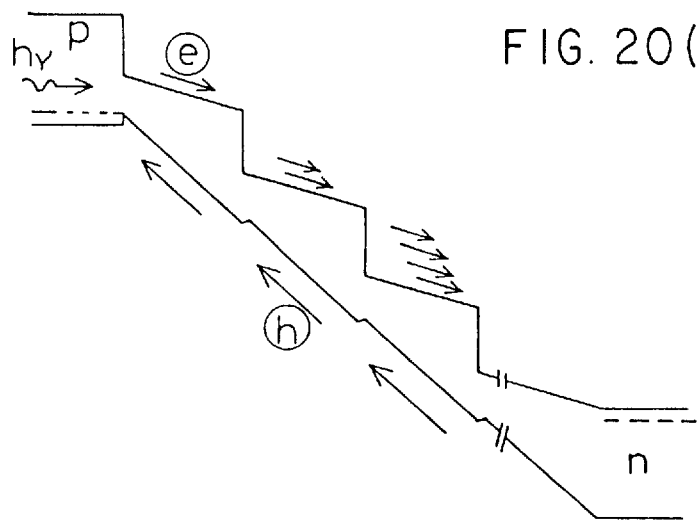

In this case, during the application of a voltage, the energy barrier can be removed, as shown in FIG. 20(c), so that it is possible to cause an electron avalanche phenomenon to take place even more readily.

In the foregoing vertical super lattice APD, photoelectrons move in the direction of the film thickness, and it is also possible to form a horizontal super lattice APD by forming an APD structure which has a configuration that is obtained by cutting the stacked APD structure in a direction perpendicular to the layer direction, and stacking it on the charge generation layer such that the cut surface is in contact with the charge generation layer.

Figure 20D:
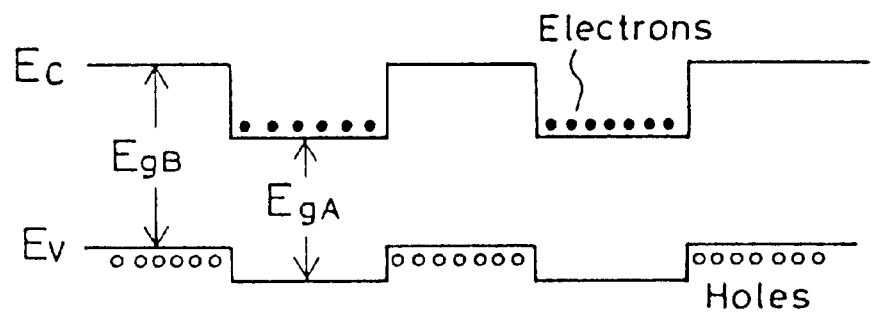
Figure 20E:
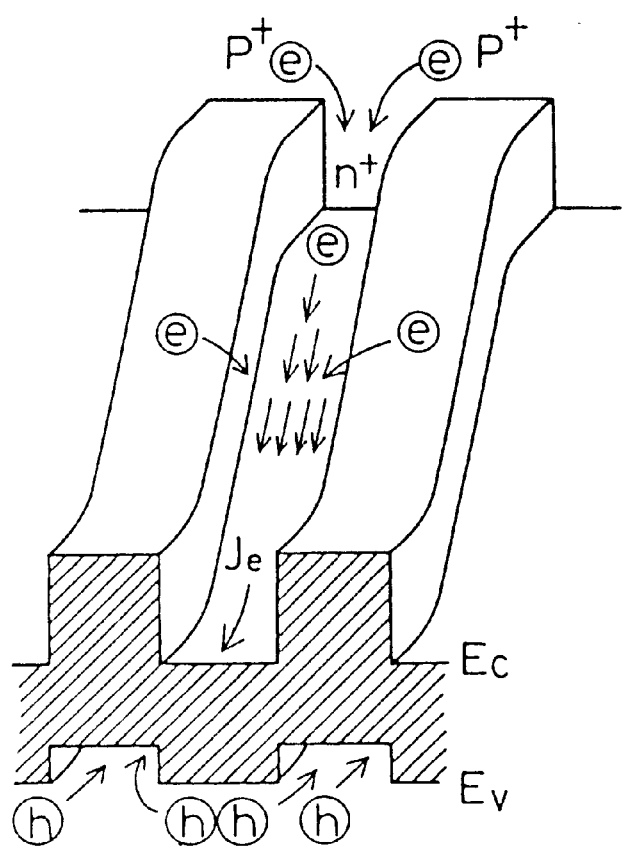

The energy band structure of this APD is shown in FIG. 20(d).

As will be understood from this figure, the energy level difference between the $p^+$- and $n^+$-layers at the conduction band can be made larger than that at the valence band, and it is therefore possible to cause an electron avalanche phenomenon when photoelectrons move from a $p^+$-layer to an $n^+$-layer.

These APD layers are effective when the electrode is defined as a negative electrode. However, it is also possible to use an APD layer that exhibits a hole avalanche effect, and in such a case the polarity of the electrode is preferably set positive.

A charge transport layer is further stacked on the APD layer formed in this way.

The charge transport layer, which transports light carriers when irradiated with light, needs to be formed so as to transport either holes or electrons in accordance with the polarity of the electrode of the photosensitive member.

If the electrode is positive (+), it is preferable to use an amorphous selenium having excellent hole transport properties, or an organic photosensitive material, for example, a hydrazone, pyrazoline, PVK, carbazole, oxazole, triazole, aromatic amine, amine, triphenylmethane or polycyclic aromatic compound photosensitive material.

In the case of a-Se, it can be formed on the charge generation layer by evaporation, sputtering, etc. It is preferable to stack at least one layer of a-Se, amorphous selenium tellurium, amorphous arsenic selenium compound (a-$As_2Se_3$), amorphous arsenic selenium compound (a-$As_2Se_3$)+tellurium, etc. or a combination of various kinds of a-Se. In the case of an organic photosensitive material, it is preferable to dissolve it in a solvent and coat the resulting solution on the charge generation layer by spinner coating, for example.

If the electrode is negative (−), it is preferable to use zinc oxide or the like, which has excellent electron transport properties. The method of formation may be coating or CVD. In the case of coating, it is preferable to disperse zinc sulfide particles (particle diameter: 1 to 100 μm) into a binder, add a solvent thereto and coat the resulting solution on the charge generation layer, or mix together an organic metal, for example, diethylzinc, dimethylzinc, etc., and oxygen gas under a low vacuum ($10^{-2}$ to 1 Torr) and cause the mixture to take place a chemical reaction on the charge generation layer heated (150° C. to 400° C.) so that it is deposited in the form of a zinc oxide film.

When coating process is used, 0.1 to 10 parts of a binder, for example, a silicone resin, styrene-butadiene copolymer resin, epoxy resin, acrylic resin, saturated or unsaturated polyester resin, polycarbonate resin, polyvinyl acetal resin, phenolic resin, polymethyl methacrylate (PMMA) resin, melamine resin, polyimide resin, etc., is added to 1 part of a charge transport material with a view to facilitating adhesion. As a coating method, it is possible to use dipping, evaporation, sputtering, etc.

A solvent which is preferably used depends on the kind of binder used and the kind of charge generating material used. It is, however, preferable to use a chlorine solvent (chloroform, dichloroethane, dichloromethane, etc.), THF, dioxane, toluene, MEK and alcohols alone or in the form of a mixture.

In regard to the film thickness, it is preferable that the charge generation layer 809a should have a film thickness of from 0.1 to 10 μm, the APD layer 809b, from 0.01 to 10 μm (either the vertical or horizontal type), and the charge transport layer 809c, from 10 to 50 μm.

Examples will be explained below.

EXAMPLE 14

On a glass substrate (1 mm in thickness) was provided an ITO transpareht electrode of 1000 Å by sputtering, and an amorphous silicon layer was stacked as a charge generation layer on the electrode to a film thickness of 2 μm by plasma CVD, thereby forming a charge generation layer. Then, a vertical super lattice APD layer was stacked on the amorphous silicon layer, the APD layer being formed by cyclically stacking 50 pn junctions to a film thickness of 5 μm by MBE method and stacked on the charge generation layer such that the p-layer side was in contact with the charge generation layer, each pn junction being formed using Ga-As and represented by the following unit composition formula:

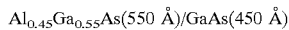

$Al_{0.45}Ga_{0.55}As$(550 Å)/GaAs(450 Å)

Then, an a-Se layer was stacked as a charge transport layer on the APD layer to a film thickness of 20 μm by vacuum evaporation ($10^{-5}$ Torr; resistive heating), thereby preparing a photosensitive member 1 of the present invention.

In the meantime, a glass substrate (1 mm in thickness) having Al deposited thereon to 1000 Å was coated with a silicone resin solution (TSR-144, CR-15, 1%; manufactured by Toshiba Silicone Co., Ltd.) by spinner coating (1000 rpm×30 s) and then dried for 1 hour at 150° C. to prepare an electrostatic information recording medium having a charge retaining layer with a film thickness of 7 μm.

The photosensitive member and the electrostatic information recording medium, which were prepared in this way, were disposed face-to-face with each other across an air gap of 10 μm that was defined by a spacer comprising a PET film of 10 μm, as shown in FIG. 2, and a voltage of 750 V was applied to the two electrodes with the ITO side electrode being defined as a positive electrode. In this state, pattern exposure was carried out for 1 second with halogen lamp light of 10 lux. At the same time as the exposure finished, the supply of the voltage was cut off.

After the completion of the exposure, the electrostatic information recording medium was taken out, and the surface potential thereof was measured. At the exposed region a potential of +400 V was measured, whereas, at the unexposed region the potential was +150 V.

Comparative Example

Electrostatic information recording was conducted in the same way as in Example 14 by using the same photosensitive member as in Example 14 except that the photoconductive layer had no APD layer, but comprised only the charge generation layer and the charge transport layer. As a result, 150 V was measured at the exposed region of the electrostatic information recording medium, and 100 V at the unexposed region. In comparison to the photosensitive member provided with the APD layer according to the present invention, the amount of charge at the exposed region is low, and the contrast ratio of the exposed region to the unexposed region is not satisfactorily high. Thus, an image that was not very clear was obtained.

Industrial Applicability

The photosensitive member of the present invention is used in such a manner that it is disposed on an optical axis in opposing relation to an electrostatic information recording medium comprising an electrode layer and a charge retaining layer and exposure is carried out with a voltage being applied to the two electrodes, thereby forming an electrostatic latent image on the electrostatic information recording medium in accordance with an incident optical image, the photosensitive member being designed to provide a high sensitivity in the electrostatic information recording and also provide a high contrast ratio of the exposed region to the unexposed region.

The electrostatic information recording medium that has electrostatic information recorded thereon by the photosensitive member of the present invention may be stacked on a substrate for a card, for example, a prepaid card, credit card, etc., to form an electrostatic information recording card. In such a case, the electrostatic information recording medium may be buried in a card substrate with the charge retaining layer surface exposed, or it may be bonded to the surface of a card substrate. The electrostatic information recording medium may be stacked on a card substrate with or without information recorded thereon. Information may be recorded either in the form of an electric charge or in a toner developed form.

To enable recording of information after an electrostatic information recording medium has been fabricated in a card form, it is preferable to expose a part of the electrode of the electrostatic information recording medium at a proper portion of the card substrate so that it is possible to make a connection between the electrode and the photosensitive member electrode. By doing so, it is possible not only to fabricate an electrostatic information recording medium having information recorded thereon into a card form but also to fabricate an unrecorded electrostatic information recording medium into a card form and record information thereon when it is actually used. In such a case, a protective film may be stacked on the charge retaining layer in such a manner that the film can be separated therefrom, or a thin protective film may be stacked on the charge retaining layer so that recording can be effected through the protective film. In particular, if digital information such as (0·1) information is recorded by irradiation with a beam through a scanning operation, the recorded charge can be stored in this state or in a toner developed form. In addition, it is possible to readily display the recorded information on a CRT by use of a potential reading means and reproducing means, and it is also possible to output it through a printer. A read means that is used for optical cards may also be utilized.

If information is recorded in the form of an electrostatic charge pattern, since it is invisible, it is possible to utilize it as a means for preventing forgery of a card or the like. In addition, the storage capacity is large, and planar recording can be effected at one time by planar exposure, so that it is possible to process information in a planar form. It is also possible to input and output an electric signal and effect planar input of image data. Further, various kinds of data, i.e., analog, digital, image, sound and (0·1) information, can be recorded. It is also possible to utilize the electrostatic information recording medium as an external memory for a computer. In addition, the record can be erased with ease.

When sound information is to be recorded simultaneously, it is preferable to define a part of the information recording region on the electrostatic information recording medium as a sound information recording region. In the electrostatic information recording method, sound is preferably recorded after being converted into optical information. The sound information recording region is disposed at the peripheral portion of the electrostatic information recording medium. Thus, it is possible to realize an electrostatic information recording medium which has a sound information recording region as well as a region for recording form, line drawing, image, code and (1·0) information.

The electrostatic information recording medium can be used not only for electrostatic recording cards but also for magnetic cards, IC cards, ROM-type, DRAW-type and EDRAW-type optical cards and marking cards by changing information input means with the electrostatic information recording medium being used as a master. It is also possible to utilize the electrostatic information recording medium for a plurality of purposes by providing different recording regions.

Accordingly, the electrostatic information recording medium can be utilized as a recording means for, for example, ID cards, prepaid cards, credit cards, pocket calculators, electronic notebooks, cameras, patient's case records, timetables, maps, electronic locks, miniature books, visiting cards, dust remover, batteries, bar codes, Karaoke (recorded instrumental accompaniment) systems, messages (communication means, e.g, post cards), records, games, training tools, etc. The electrostatic recording card can also be utilized as a recording medium in banking systems, ID systems, prepaid systems, credit systems, note issuing systems, medical examination systems, navigation systems, electronic lock systems, message systems, game systems and training systems.

What is claimed is:

1. A photosensitive member configured to be disposed opposite to an electrostatic information recording medium having a charge retaining layer with a first electrode on a rear side thereof, said photosensitive member comprising:

a second electrode provided on a front side thereof; and a photoconductive layer disposed on said second electrode, said photoconductive layer comprising a charge generation layer, a super lattice avalanche photodiode layer disposed on said charge generation layer on said second electrode, and a charge transport layer, wherein said photosensitive member carries out exposure with a voltage applied between said first and second electrodes thereby forming an electrostatic charge pattern on said electrostatic information recording medium according to an exposure light pattern.

2. A photosensitive member according to claim 1, wherein said photosensitive member is configured to contact said electrostatic information recording medium.

3. An electrostatic information recording and reproducing method, said method comprising the steps of:

providing a photosensitive member having a first electrode on a front side thereof with a photoconductive layer disposed on said electrode, said photoconductive layer including a charge generation layer on said electrode, a super lattice avalanche photodiode disposed on said charge generation layer, and a charge transport layer disposed on said super lattice avalanche photodiode;

providing an information recording medium having a charge retaining layer with a second electrode provided on a rear side thereof, said electrostatic information recording medium being disposed opposite said photosensitive member;

applying a voltage between said first and second electrode in accordance with an exposure light pattern, thereby exposing the electrostatic information recording medium by forming an electrostatic charge pattern thereupon, and reproducing said electrostatic charge pattern by using a reading the electric charge means for reading.

4. An electrostatic information recording and reproducing method as recited in claim 3, further comprising performing, prior to said voltage application step, a step of contacting said electrostatic information recording medium with said photosensitive member.

* * * * *